US007653858B2

(12) United States Patent
Nefedov

(10) Patent No.: US 7,653,858 B2
(45) Date of Patent: Jan. 26, 2010

(54) LOW COMPLEXITY DECODING SCHEMES FOR SINGLE-PARITY-CHECK (SPC) BASED CONCATENATED CODES

(75) Inventor: Nikolai Nefedov, Espoo (FI)

(73) Assignee: Nokia Corporation, Espoo (FI)

( * ) Notice: Subject to any disclaimer, the term of this patent is extended or adjusted under 35 U.S.C. 154(b) by 1893 days.

(21) Appl. No.: 10/325,240

(22) Filed: Dec. 20, 2002

(65) Prior Publication Data

US 2004/0123216 A1      Jun. 24, 2004

(51) Int. Cl.
H03M 13/29 (2006.01)
H03M 13/45 (2006.01)

(52) U.S. Cl. .................................. 714/755; 714/780

(58) Field of Classification Search ............ 714/755, 714/780
See application file for complete search history.

(56) References Cited

U.S. PATENT DOCUMENTS 7,249,307 B2 *  7/2007 Varshney et al. ............ 714/758
7,458,011 B2 * 11/2008 Nefedov ..................... 714/800

OTHER PUBLICATIONS

Huang, X., et al., "BER Bounds on Parallel Concatenated Single Parity Check Arrays and Zigzag Codes", Globecomm '99, 1999, pp. 2436-2440.*
Bonghoe Kim et al., "Reduction of the Number of Iterations in Turbo Decoding Using Extrinsic Information", Sep. 15, 1999, Proc. Of the IEEE Region 10 Conference, Cheju Island, South Korea, vol. 1, pp. 494-497.
Zhai F et al., "New Error Detection Techiques and Stopping Criteria for Turbo Decoding", Mar. 7, 2000, Canadian Conference on Electrical and Computer Engineering, vol. 1, pp. 58-62.

Wu Y et al., "A Simple Stopping Criterion for Turbo Decoding", Aug. 2000, IEEE Communications Letters, IEEE Service Center, Piscataway, US, vol. 4 No. 8, pp. 258-260.
Reid A C et al., "Convergence and Errors in Turbo-Decoding", Dec. 2001, IEEE Transactions on Communications, IEEE, USA, vol. 49, No. 12, pp. 2045-2051.
Kim D-H et al., "A Novel Turbo Decoder Architecture for Hand-Held Communication Devices", May 2002, IEEE Transactions on consumer Electronics, IEEE Inc, New York, US, vol. 48, No. 2, pp. 202-208.

(Continued)

Primary Examiner—Stephen M Baker
(74) Attorney, Agent, or Firm—Harrington & Smith, PC

(57) ABSTRACT

This invention provides an iterative PCZZ data decoder that includes circuitry for utilizing all extrinsic information during iterative decoding by updating likelihood information for parity bits $L_{Pi}$, i=1, . . . , M during iterations. The extrinsic information for the parity bits is included in iterations by re-calculating soft values for parity bits $L_{Pi}^{(k)}$ for each iteration k. In one embodiment the parity bit soft values are re-calculated in a plurality of circuit blocks following Max-Log-APP (MLA) decoder blocks, based on soft values for data bits $L_{Di}^{(k)}$. In another embodiment the parity bit soft values are re-calculated recursively within the plurality of MLA decoders. The decoder operates to control the convergence of the decoder by monitoring a soft value of one parity check symbol, e.g., $L^{(k-1)}[p(IM)]$, where p(IM) represents the last parity check bit in an I×M parity check array. A decoder iteration stopping rule may be implemented by testing a likelihood measure associated with a last parity check symbol in a parity check column. In one case the likelihood measure may be given by $L^{(k-1)}[p(IM)]>$threshold, and in another case the likelihood measure may be given by $L^{(k-1)}[p(I)]>$threshold. The likelihood measure is given in general by: $L^{(k-1)}[p(I)]>$threshold, $L^{(k-1)}[p(2I)]>$threshold, . . . , $L^{(k-1)}[p(IM)]>$threshold, where the value of the threshold is a function of data block size.

24 Claims, 25 Drawing Sheets

OTHER PUBLICATIONS

Li Ping, et al., "Zigzag Codes and Concatenated Zigzag Codes", IEEE Transactions on INformation Theory, vol. 47, No. 2, Feb. 2001, pp. 800-807.

Xiaoling Huang et al., "Turbo Codes and Zigzag Codes: Performance Analysis and Simulation", Dec. 2000; http://www.ece.sunysb.edu/{phamdo/xhua ng.pdf>.

Nikolai Nefedov, "Evaluation of Low Complexity Concatenated Codes for High Data Rate Transmission", IEEE 2003 International Symposium on Personal, Indoor and Mobile Radio Communication Proceedings, pp. 1868-1872.

Tadashi Minowa et al., "Decoding of High-Rate Turbo Codes Using A Syndrome Trellis", IEEEE 2001, pp. 74-78.

Audrey Viterbi et al., "New Results On Serial Concatenated And Accumulated-Convolutional Turbo Code Performance", Ann. Telecommun., 54, No. 3-4, 1999, pp. 173-182.

Nikolai Nefedov et al., "Performance of Low Complexity Concatenated Codes Formed By Differential Encoders", Proceeding of the International Conference on Telecommunications, Publishing House of Electronics Industry, Beijing, China, vol. 1, Jun. 23, 2002, XP009037088, pp. 151-155.

K.S. Chan et al., "A Data Link Control Protocol for Wireless ATM Networks With Adaptive Coding Rate", Proceedings of the IEEE Conference 2000 on High Performance Switching and Routing, Heidelberg, Germany, Jun. 26, 2000, XP001075738, pp. 483-489.

K.S. Chan et al., "Adaptive Type II Hybrid ARQ Scheme Using Zigzag Code", Electronics Letters, IEEE Stevenage, GB, vol. 35, No. 24, Nov. 25, 1999, 2 pgs.

Ping et al., "Iterative Decoding of Multidimensional Concatenated Single Parity Check Codes", Proc. IEEE ICCC 1998, vol. 1, Conf. 5, XP000898688, pp. 131-135.

Ping et al., "Zigzag Codes And Concatenated Zigzag Codes", Proceedings of Information Theory and Networking Workshop, Metsovo, Greece, Jun. 27, 1999, XP010365580, 1pg.

\* cited by examiner

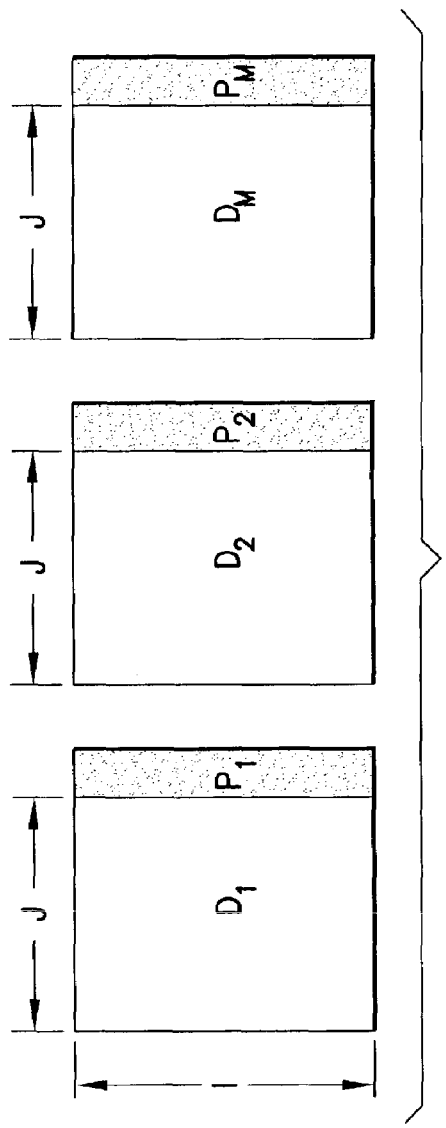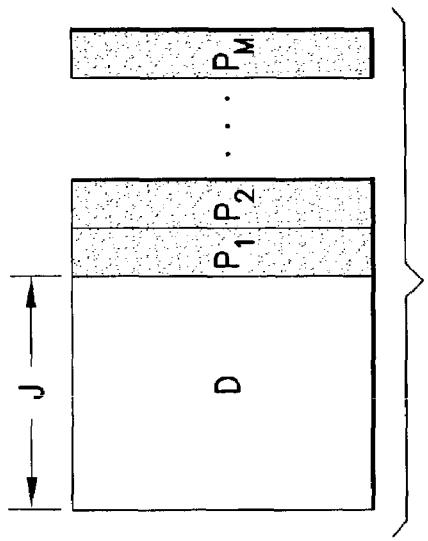
FIG.2A PRIOR ART
FIG.2B PRIOR ART

FIG. 20A  $p(i) = \sum_{j=1}^{j} d(i,j) \bmod 2$  — EQ.1

FIG. 20B  $L_k = \log\left(\frac{\Pr\{c_k = +1\}}{\Pr\{c_k = -1\}}\right) = \log\left(\frac{\exp\{-(x_k-1)^2/2\sigma^2\}}{\exp\{-(x_k+1)^2/2\sigma^2\}}\right) = \frac{2x_k}{\sigma^2}$   FOR $k = 1, 2, \ldots, N$  — EQ.2

FIG. 20C  -MAP  $L[c_k] = \log \dfrac{\sum_{c_k=+1} \exp(1/2 \langle c, L \rangle)}{\sum_{c_k=-1} \exp(1/2 \langle c, L \rangle)}$  — EQ.3

FIG. 20D  -Max-Log-MAP: $L[c_k] \simeq 1/2\left(\max_{c_k=+1} \langle c, L \rangle - \max_{c_k=-1} \langle c, L \rangle\right)$  — EQ.4

FIG. 20E  $p(i) = p(i-1) + \sum_{j=1}^{j} d(i,j)$,    $i = 2, 3, \ldots, I$  — EQ.5

FIG. 20F  $w(z_1, z_2, \ldots, z_n) \triangleq \left[\prod_{j=1}^{n} \mathrm{sign}(z_j)\right] \cdot \min_j |z_j|$  — EQ.6

FIG.20G
$$L[\tilde{d}(i,j)] = \tilde{d}(i,j) + W(F[p(i-1)], \tilde{d}(i,1), \tilde{d}(i,2), ..., \tilde{d}(i,j-1), \tilde{d}(i,j+1), ..., \tilde{d}(i,J), B[p(i)]) \quad \text{EQ.7}$$

FIG.20H
$$F[p(i)] = \tilde{p}(i) + W(F[p(i-1)], \tilde{d}(i,1), ..., \tilde{d}(i,J)) \quad \text{EQ.8}$$

FIG.20I
$$B[p(i-1)] = \tilde{p}(i-1) + W(F[\tilde{d}(i,1)], ..., \tilde{d}(i,J), B[\tilde{p}(i)]) \quad \text{EQ.9}$$

FIG.20J
$$F[p(0)] = +\infty, \quad B[p(I)] = \tilde{p}(I) \quad \text{EQ.10}$$

FIG.20K
$$\begin{cases} T(W,Z) = \sum_{h=0}^{N} A_h(W) \, z^h & \text{EQ.11A} \\ \text{WHERE } A_h(W) = \sum_{w=0}^{K} T_{w,h} \, W^w & \text{EQ.11B} \end{cases}$$

$$T_e^i(w,z) = T_e^{i-1}(w,z)B_e(w) + T_o^{i-1}(w,z)B_o(w) \quad \text{EQ.12A}$$

$$T_o^i(w,z) = [T_o^{i-1}(w,z)B_e(w) + T_e^{i-1}(w,z)B_o(w)]z \quad \text{EQ.12B}$$

WHERE $$B_e(w) \triangleq T_e^1(w,z) = \sum_{j=0}^{[J/2]} \binom{J}{2j} w^{2j}, \quad \text{EQ.12C}$$

$$B_o(w)z \triangleq T_o^1(w,z) = \sum_{j=0}^{[(J-1)/2]} \binom{J}{2j+1} w^{2j+1}z \quad \text{EQ.12D}$$

FIG.20L

$$p(I) = \sum_{i=1}^{I} \sum_{j=1}^{J} d(i,j) \quad \text{EQ.13}$$

FIG.20M

$$L^{(k)}[p(i)] = W(L^{(k-1)}[p(i-1)], L^{(k-1)}[d(i,1)], L^{(k-1)}[d(i,2)], \ldots ,$$

$$L^{(k-1)}[d(i,J-1)], L^{(k-1)}[d(i,J)]) \quad \text{EQ.14}$$

FIG.20N

TABLE 1

| CODE | ITERATIONS | INTERLEAVERS | AEO/IB |
|---|---|---|---|
| WCDMA TURBO CODE | 8 | 1 | 3000 |
| ACC(m=1) | 10 | 1 | 500 |
| PCZZ(M=3) | 20 | 3 | 300 |

FIG.21A

TABLE 2

| SNR [dB] | CORRECT CONVERGENCE: IDEAL STOP | TOTAL NUMBER: IDEAL STOP | CONVERGENCE: REAL STOP | TOTAL NUMBER: REAL STOP |
|---|---|---|---|---|
| 3 | 8.7 | 19.6 | 10.3 | 19.64 |
| 4 | 3.9 | 6.4 | 6.33 | 9.45 |
| 4.5 | 2.45 | 3.2 | 4.33 | 4.9 |
| 5 | 1.4 | 1.5 | 3.37 | 3.44 |

FIG.21B

LOW COMPLEXITY DECODING SCHEMES FOR SINGLE-PARITY-CHECK (SPC) BASED CONCATENATED CODES

TECHNICAL FIELD

The teachings of this invention relate generally to coders for encoding data prior to transmitting the data through a channel, and more specifically relate to convolutional codes (CC), parallel concatenated convolution codes (PCCC), or turbo codes, and reduced complexity accumulated convolutional codes (ACC), single-parity-check (SPC) codes and zigzag codes and their concatenations, as well as to decoders for same.

BACKGROUND OF THE INVENTION

State-of-the-art high data rate coded transmission concepts require the development of efficient channel coding schemes. It has become apparent that the parallel concatenated convolution codes (PCCC), or turbo codes, currently specified for Wideband Code Division Multiple Access (WCDMA) may not be the optimum choice for use with very high coding rates, such as those required for HSDPA (high speed downlink packet access) having transmission rates above 10 Mbps. In addition, the decoding complexity of turbo codes is currently still rather high.

In general, turbo codes (see C. Berrou, A. Glavieux, P. Thitimajshima, Near Shannon limit error-correcting coding and decoding, Proc. IEEE ICC'93, pp.1064-1070, 1993) have been shown to approach the Shannon capacity, and currently are included in several wireless communications standards. One standard of interest is the one proposed for the third generation partnership project (3GPP) class of wireless communications devices having high speed packet data capabilities. However, the decoding complexity of the classical turbo codes, based on a posteriori probability (APP) decoding for the component codes, still remains too great for many practical applications. In an attempt to reduce the decoding complexity, a number of turbo-like codes and decoding algorithms have been proposed.

One class of turbo-like constructions are formed by 2-state convolutional codes (CC). A serial code concatenation with 2-state, rate 1 recursive CC as the inner code was introduced by D. Divsalar and F. Pollara, Serial and hybrid concatenated codes with applications, Proc. Int. Symp. on Turbo Codes, Brest, pp. 80-87, September 1997. The inner encoder is equivalent to a simple differential encoder, and may be treated as an accumulator. This approach later lead to so-called repeat-accumulate codes (see D. Divsalar, H. Jin, R. McEliece, Coding theorem for turbo-like codes, Allerton Conf., September 1998), where the outer code is a rate R repetition code. More recently, code constructions with an accumulator as the inner encoder, and CC as the outer coder, have been proposed and are referred to as Accumulated CC (or ACC). Reference in this regard can be had to A. M. Viterbi and A. J. Viterbi, New results on serial concatenated and accumulated-convolutional turbo code performance, Annales des Telecommunications, 54, No.3-4, pp. 173-182, 1999.

The simplest ACC, where the outer code is a CC with memory m=1, ACC(m=1), is shown in FIG. 1, and was presented by the inventor in N. Nefedov, Application of low complexity serially concatenated codes for EDGE circuit switched data, Proc. IEEE PIMRC'99, Osaka, pp. 573-577, September 1999, and in N. Nefedov, Comparison of Low Complexity Turbo-Like Coding Structures, Proc. IEEE ICC'01, pp. 50-54, 2001.

Another class of low complexity, turbo-like codes is based on concatenations of simple single-parity-check (SPC) codes (e.g., see G. Caire, G. Taricco and G. Battail, Weight Distribution and Performance of the Iterated Product of Single-Parity-Check Codes, Proc. IEEE Globecom 1994, and L. Ping, S. Chan, and K. L. Yeung, Iterative Decoding of Multidimensional Concatenated Single Parity Check Codes, in Proc. IEEE ICC'98, pp. 131-135, 1998). These types of codes can be shown to exhibit good performance at high coding rates.

Recently, zigzag codes and their concatenations have been suggested in order to improve the convergence and performance of SPC-based codes at medium coding rates (see L. Ping, X. Huang and N. Phamdo, Zigzag Codes and Concatenated Zigzag Codes, IEEE Trans. Information Theory; vol. 47, pp. 800-807, February 2001).

However, prior to this invention there was no optimum solution to the problems inherent in the use of turbo codes, or in the reduced complexity code approaches outlined above.

SUMMARY OF THE INVENTION

The foregoing and other problems are overcome by methods and apparatus in accordance with embodiments of this invention.

This invention provides concatenated coding constructions formed by simple encoders. In particular, parallel concatenated SPC (single-parity check)-based zigzag codes, and low complexity accumulated convolutional codes (ACC) formed by differential encoders, are considered. The decoding complexity of these constructions is shown to be significantly less than (up to an order of magnitude less than) the complexity of turbo codes specified in 3GPP. To perform a comparison of performance, tight upper bounds for block and bit error probabilities where used and verified against simulation results. It is shown that properly constructed zigzag codes, while showing some loss (about 0.2 dB) at a coding rate of 0.75, outperform turbo codes at very high (e.g., R>0.9) coding rates. Even at medium coding rates (e.g., 0.75<R<0.9) the low complexity constructions, such as ACC and zigzag codes, are within 0.1 dB and 0.4 dB, respectively, of the required 3GPP turbo code performance. The ACC is shown to be a preferred embodiment at medium coding rates, while the zigzag-based constructions are presently preferred at high coding rates. Generalized zigzag codes, and modifications for zigzag decoders to improve performance and reduce complexity, are also disclosed.

This invention provides an iterative PCZZ data decoder that includes circuitry for utilizing all extrinsic information during iterative decoding by updating likelihood information for parity bits $L_{P_i}$, i=1, ..., M during iterations. The extrinsic information for the parity bits is included in iterations by re-calculating soft values for parity bits $L_{P_i}^{(k)}$ for each iteration k. In one embodiment the parity bit soft values are re-calculated in a plurality of circuit blocks following Max-Log-APP (MLA) decoder blocks, based on soft values for data bits $L_{D_i}^{(k)}$. In another embodiment the parity bit soft values are re-calculated recursively within the plurality of MLA decoders. The decoder operates to control the convergence of the decoder by monitoring a soft value of one parity check symbol, e.g., $L^{(k-1)}[p(IM)]$, where p(IM) represents the last parity check bit in an I×M parity check array. A decoder iteration stopping rule may be implemented by testing a likelihood measure associated with a last parity check symbol in a parity check column. As examples, in one case the likelihood measure may be given by $L^{(k-1)}[p(IM)]$>threshold, and in another case the likelihood measure may be given by $L^{(k-1)}[p(I)]$> threshold, where the value of the threshold is a function of data block size. In general, all of the following conditions are valid and can be employed: $L^{(k-1)}[p(I)]>$ threshold, $L^{(k-1)}[p(2I)]>$ threshold, ..., $L^{(k-1)}[p(IM)]>$ threshold.

BRIEF DESCRIPTION OF THE DRAWINGS

The above set forth and other features of these teachings are made more apparent in the ensuing Detailed Description of the Preferred Embodiments when read in conjunction with the attached Drawings, wherein:

FIGS. 2A and 2B (prior art), collectively referred to as FIG. 2, illustrate that high rate codes may be constructed using multi-dimensional SPC codes, where FIG. 2A shows the coding process, and FIG. 2B shows the overall codeword;

FIG. 3A is a graphical presentation of a zigzag code, FIG. 3B is a block diagram of a differential encoder that generates the parity bits (p) of FIG. 3A by puncturing, and FIG. 3C is a block diagram of a punctured differential encoder for producing a parallel concatenation of zigzag codes (PCZZ);

FIGS. 20A-20N show Equations 1-14, respectively, that are referred to in the detailed description of the invention;

FIGS. 21A and 21B depict Tables 1 and 2, respectively, that are also referred to in the detailed description of the invention.

DETAILED DESCRIPTION OF THE PREFERRED EMBODIMENTS

Figure 1:
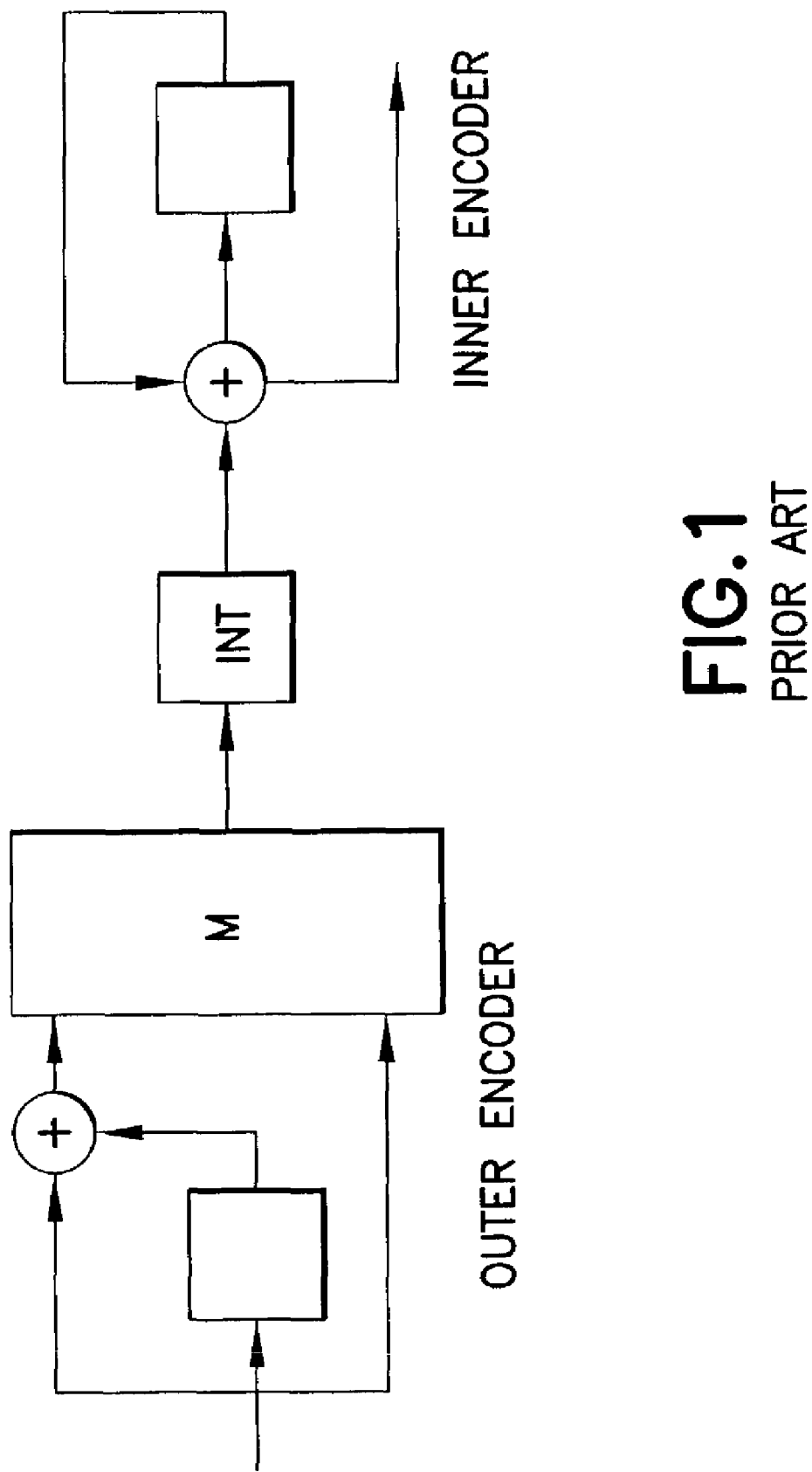
FIG. 1 is a block diagram of a prior art ACC (m=1) encoder.

In the ensuing detailed description of this invention zigzag codes are presented as punctured differential codes. By so presenting the zigzag codes one is enabled to consider the ACC and the concatenated zigzag codes as special cases of concatenated coding schemes formed by differential encoders. In order to meaningfully compare these coding structures it is preferred to use a tight bounding technique and simulation results. Reference with regard to the tight bounding technique can be made to G. Poltyrev, Bounds on the decoding error probability of binary linear codes via their spectra, IEEE Trans. on Information Theory, vol. 40, pp. 1284-1292, July 1994, and to I. Sason and S. Shamai, Improved upper bounds on the ML decoding error probability of parallel and serial concatenated turbo codes via their ensemble distance spectrum, IEEE Trans. Information Theory, vol. 46, pp. 24-47, January 2000. Next, a comparison is made of the performance of the foregoing low complexity coding schemes with turbo codes, as specified in the 3GPP standard.

Concatenated Single Parity Check Codes

The Single Parity Check (SPC) code is one of the simplest codes. For example, one can arrange K information bits in an I X J array $D=\{d(i,j)\}$, and denote $P=\{p(i), i=1,2,\ldots,I\}$ as a parity check column with a parity check bit for the $i^{th}$ row, where p(i) is shown in Eq. 1 (FIG. 20A). Information d(i,j) and parity p(i) bits are mapped into codewords $c=\{c_k:c_k=\pm 1, k=1,2,\ldots,N\}$ and are sent over a channel with additive white Gaussian noise (AWGN). Received codewords are x=c+w, where $w=\{w_k\}$ is a vector of random Gaussian variables with zero mean and variance $\sigma^2$.

Next, define a priori probability ratios $L=L_k$ constructed from received symbols in accordance with Eq. 2 shown in FIG. 20B. Then MAP and Max-Log-MAP decoding algorithms may be presented as shown in Eqs. 3 and 4, found in FIG. 20C and FIG. 20D, respectively, where <c, L> is the inner product of c and L, and the summations are over all codewords with $c_k=+1$ and $c_k=-1$, respectively.

Due to SPC code construction every codeword c has an even number of {−1} bits. This property may be used to significantly simplify the decoding procedure. It may be shown that if the number of {−1} in a received codeword x is even, then the maximum, in limits $c_k=s_k$, of $<c,x>=<s,x>$ for all k, where $s=\{s_k\}$, $s_k=\text{sign}(x_k)$. Similar rules are found if the number of {−1} in x is odd. Based on the rules derived in the above-referenced L. Ping, S. Chan, and K. L. Yeung, Iterative Decoding of Multidimensional Concatenated Single Parity Check Codes, in Proc. IEEE ICC'98, pp. 131-135, 1998, the decoding of SPC codes needs only three addition-equivalent-operations (AEO) per information bit (IB), as compared to 20 AEO/IB required by trellis-based decoding techniques.

High rate codes may be constructed using multi-dimensional SPC codes. In this case the data array D is interleaved by M interleavers to form $D_M$ data arrays with $P_M$ parity check columns. Finally, rate J/(J+M) codewords are formed as $\{D,P_1,P_2,\ldots P_M\}$, as shown in FIG. 2, where FIG. 2A shows the coding process, and FIG. 2B shows the overall codeword.

Multi-dimensional SPC codes exhibit near-capacity performance at high coding rates, with low decoding complexity, and currently are accepted for magnetic recording and HYPERLAN standards. However, multi-dimensional and product SPC codes perform well only at high rates, and also have a relatively high error floor. Recently suggested SPC-based techniques overcome these problems, e.g., see again L. Ping, X. Huang and N. Phamdo, Zigzag Codes and Concatenated Zigzag Codes, IEEE Trans. Information Theory, vol. 47, pp. 800-807, February 2001.

ZigzagCodes

Zigzag Encoder

Following a presentation in the foregoing Ping et al. citation, arrange K information binary bits into an I X J array, $D=\{d(i,j)\}$. Let $p(i)$ be a parity check bit associated with the $i^{th}$ row. The parity check bits for zigzag codes are then computed recursively using Eq. 5 shown in FIG. 20E, where $p(0)=0$ and all summations are modulo 2.

Figure 3A:
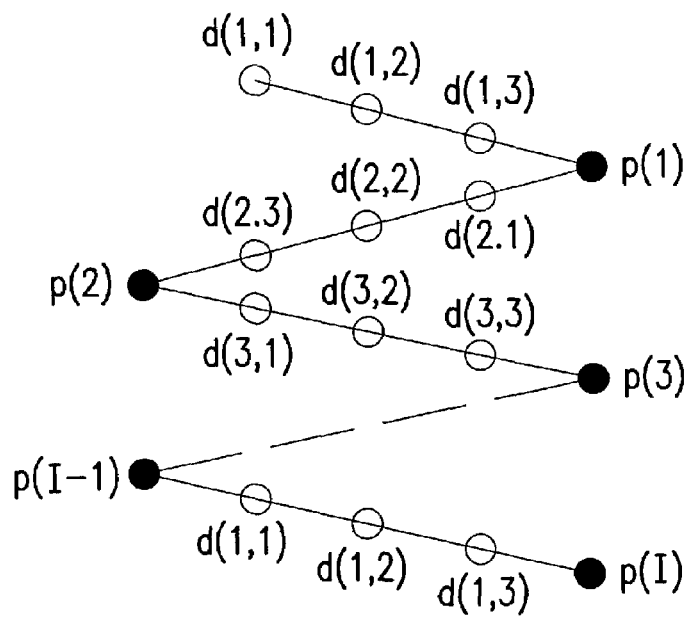
FIGS. 3A, 3B and 3C (prior art), collectively referred to as FIG. 3, pertain to zigzag codes, where
Figure 3B:
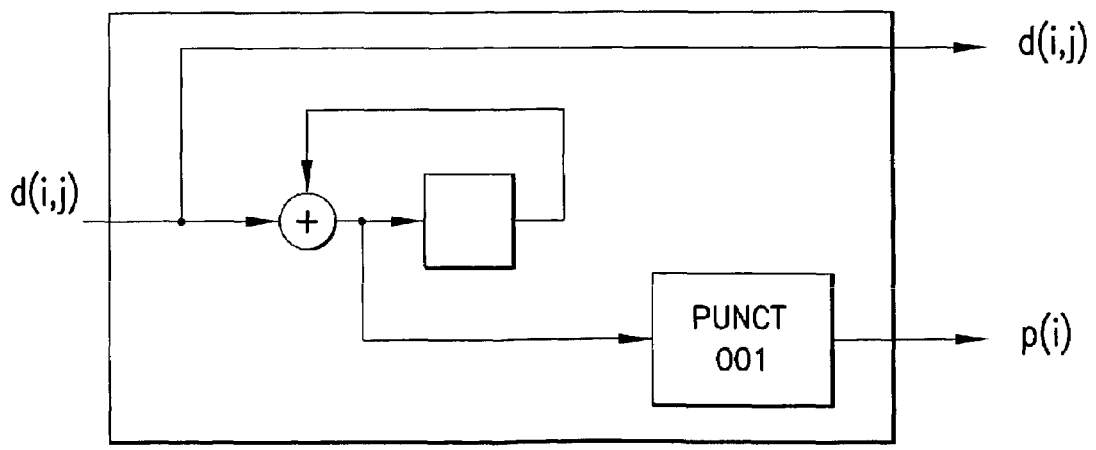
Figure 3C:
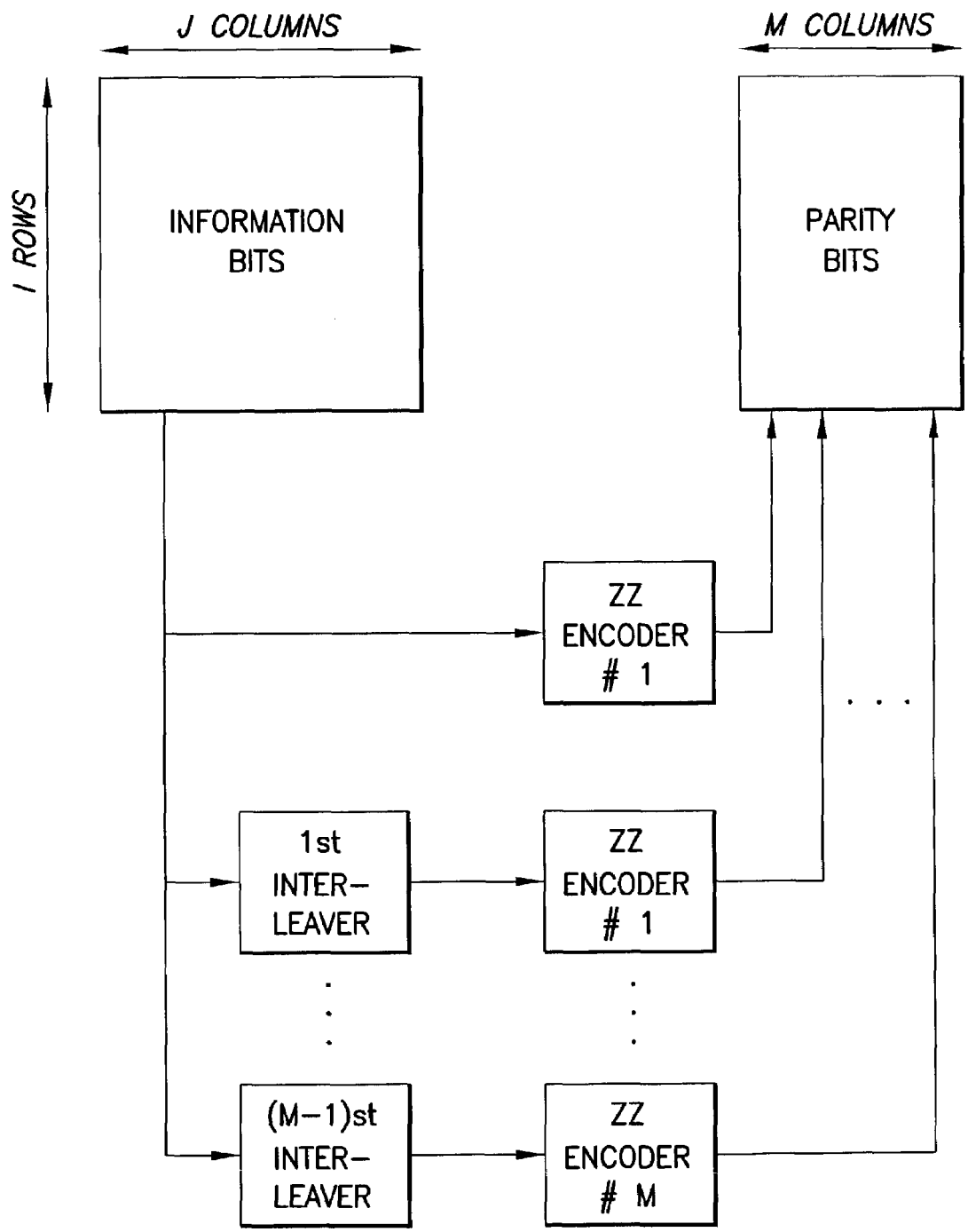

A graphical presentation of a zigzag code is shown in FIG. 3A, where white and black nodes represent information and parity bits, respectively. The reason for referring to the code as a zigzag code is immediately apparent when viewing the graphical representation. It should be noted that the parity bits may be generated by a punctured 2-state differential encoder of a type shown in FIG. 3B. Hence, the zigzag code may be viewed as a special case of convolutional codes with puncturing. Consequently, the parallel concatenation of zigzag codes (PCZZ) is a subclass of the PCCC formed by punctured differential encoders of a type shown in FIG. 3C. Omitting interleaver parameters, the PCZZ may be described by the parameter triplet (I,J,M).

Max-Log-APP (MLA) Decoder

Being a subclass of the PCCC, the PCZZ may be iteratively decoded by the standard trellis based decoders for component codes. However, due to the special puncturing forming the zigzag code, the decoding of the component codes may be significantly simplified. A low complexity, near-optimal MLA decoding algorithm for SPC-based codes is proposed by Ping et al. Following the algorithm described by Ping et al. in Zigzag Codes and Concatenated Zigzag Codes, IEEE Trans. Information Theory, vol. 47, pp. 800-807, February 2001, define a function of the form shown in Eq. 6 in FIG. 20F, and denote $d\tilde{}(i,j)$, $p\tilde{}(i)$ as received data and parity symbols, respectively, corrupted by AWGN.

The log-likelihood ratio for information bits can be approximated in the manner shown in Eq. 7 of FIG. 20G, where $F[p(i)]$ and $B[p(i)]$ are the MLA of the parity bits calculated on the forward (i=1,2, ... ,I) and the backward (i=I,I−1, ... ,2) recursions, respectively; as shown in Eqs. 8 and 9, with the boundary conditions shown in Eq. 10 (FIG. 20H, FIG. 20I, FIG. 20J).

It should be noted that the MLA decoding of zigzag codes is sub-optimal, with a ~0.5 dB loss with respect to ML decoding.

Iterative Decoder

Figure 4:
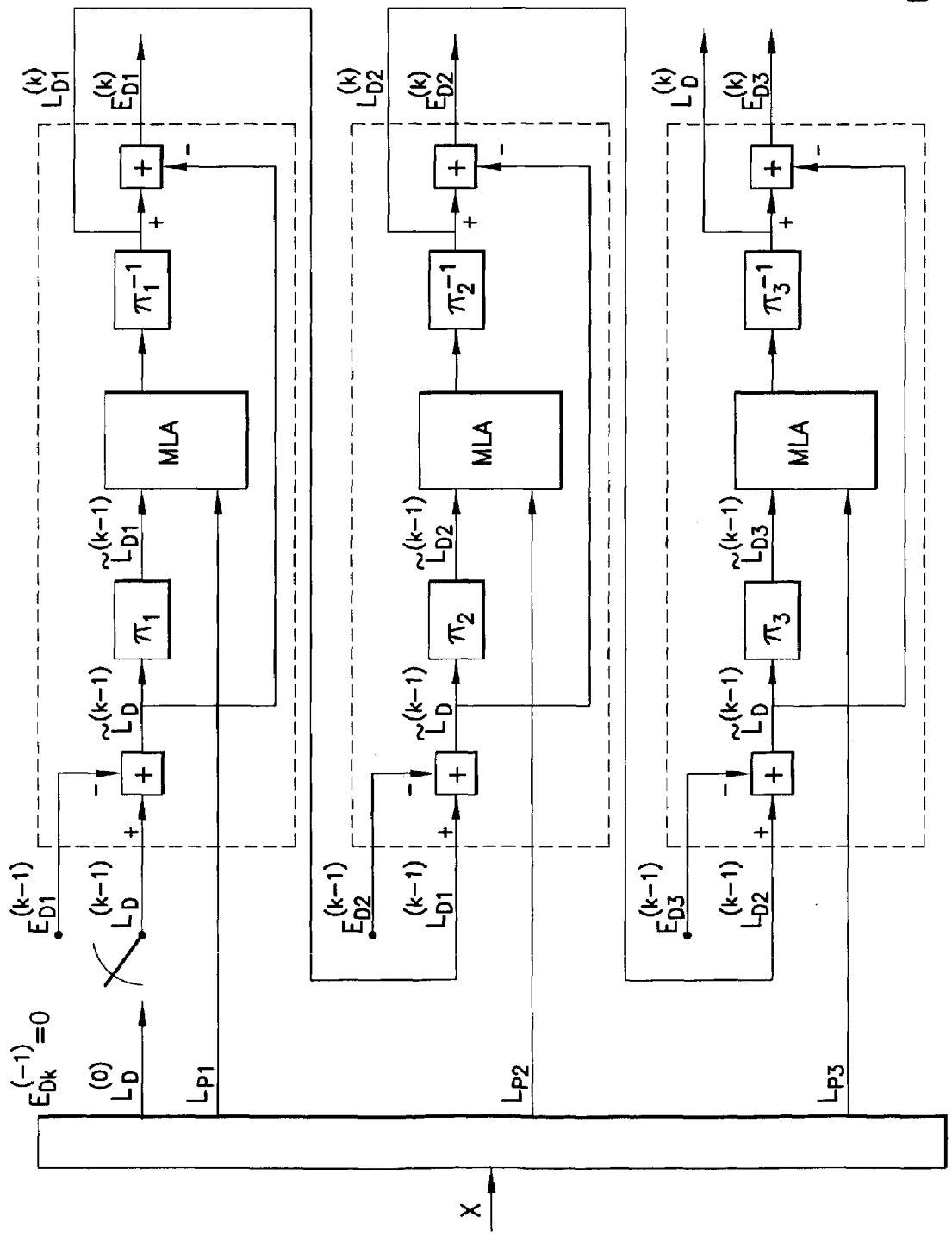
FIG. 4 is a block diagram of a prior art iterative decoder for PCZZ (M=3) at the $k^{th}$ iteration.

An iterative decoder for the parallel concatenated zigzag code includes M component decoders. Low complexity zigzag decoders may be built according to, for example, the previously cited Ping et al., Iterative Decoding of Multidimensional Concatenated Single Parity Check Codes, Proc. IEEE ICC'98, pp. 131-135, 1998. As an example, FIG. 4 presents the iterative decoder for PCZZ with M=3 interleavers and MLA component decoders. At the initial iteration the extrinsic information is absent ($E_{Di}^{(-1)}=0$, i=1 ... M), and channel likelihood ratios for systematic data $L_D^{(0)}$ and for parity symbols $L_{P1}$ from the first interleaver ($\pi_1$) are input to the first MLA-based decoder, the output of which is passed to the first de-interleaver ($\pi_1^{-1}$) The resulting likelihood ratios $L_{DI}^{(1)}$ for data together with the next parity check column $L_{P2}$ are passed to the MLA decoder corresponded to the second interleaver ($\pi_2$), and so on. At the end of the first iteration all parity check columns are processed, resulting in data $L_D^{(1)}$. At the same time the extrinsic information ($E_{Di}^{(1)}$, i=1 ... M) is calculated and collected into an I X J X M array. The result of the first iteration, $L_D^{(1)}$ and $E_{Di}^{(1)}$, is used as the input for the next iteration, and so forth.

The decoding complexity of the MLA algorithm for the concatenated zigzag codes is $M(4+4/J)$ AEO/IB bits per iteration (AEO/IB/It), excluding sign function operations and interleaving. For comparison purposes, the decoding complexity of a trellis component code is $2^m C$ (C~12 ... 20, depending on the algorithm in use), and for MLA decoding of ACC(m=1) it is about 50 AEO/IB/It.

Figure 21C:
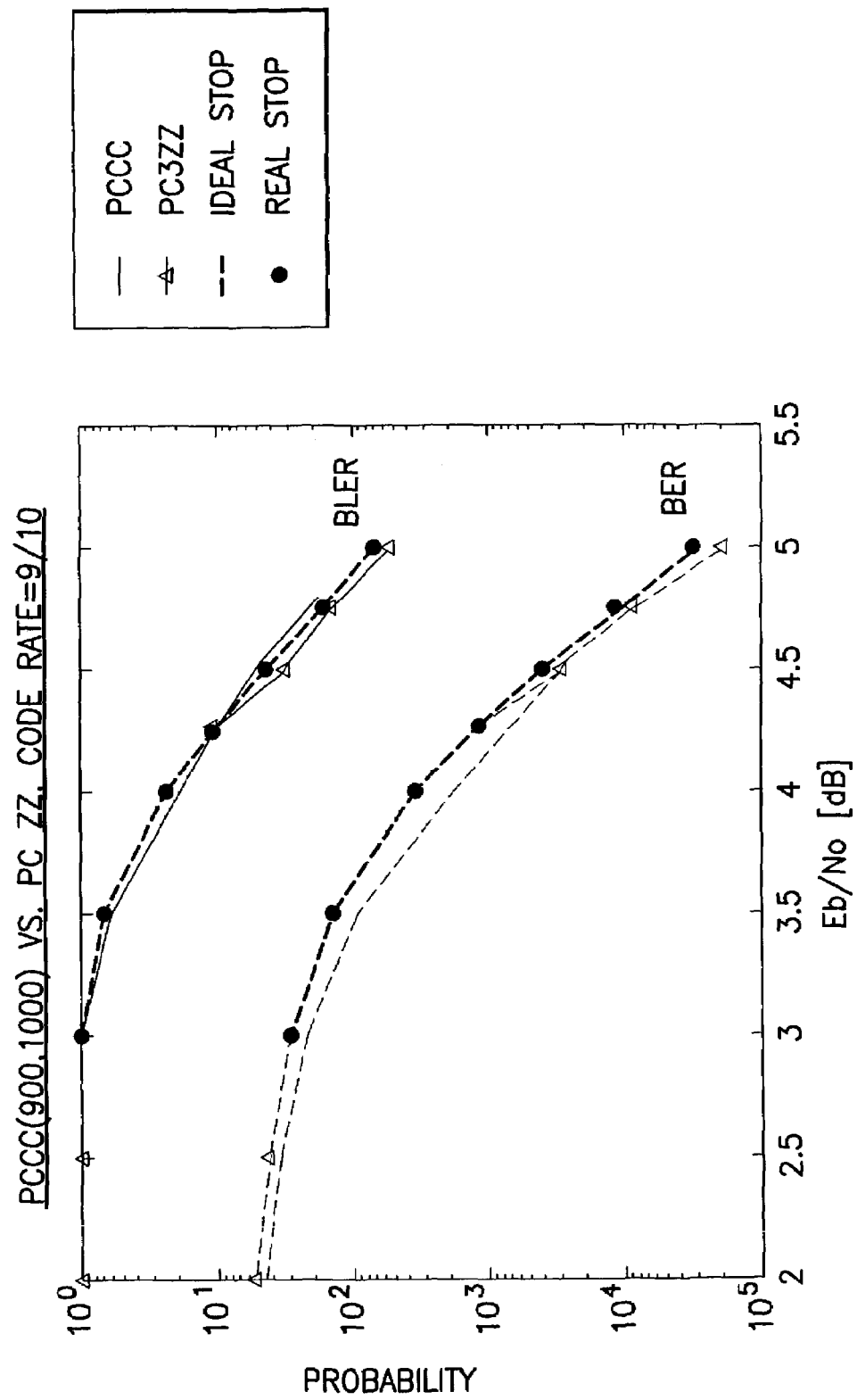
FIG. 21C is a graph that shows a performance comparison of rate 9/10 PCCC and PCZZ with different iteration stopping rules.

The decoding complexity of max-log-MAP decoders (excluding the interleavers) for different rate 1/2 coding constructions showing comparable performance is summarized in Table 1 of FIG. 21A.

A performance evaluation is now presented. With regard to the theoretical bounds, a method to obtain weight spectra for different coding constructions is first described.

For a binary block code (N,K) the input-output weight enumeration function (IOWEF) is defined, according to Viterbi et al., New results on serial concatenated and accumulated-convolutional turbo code performance, Annales des Telecommunications, 54, No.3-4, pp. 173-182, 1999, according to Eq. 11A in FIG. 2K, where Ah(W) is given by Eq. 11B in FIG. 20K, and where T w,h is a number of codewords (multiplicity) of output weight h generated by input sequences of weight w.

Based on a method of generating functions, see R. McEliece, How to compute weight enumerators for convolutional codes, Conf. in honor of P. G. Farrel, Lancaster, England, January 1998, the IOWEF calculations for concatenations of convolutional codes were presented by the inventor in N. Nefedov, Comparison of Low Complexity Turbo-Like Coding Structures, Proc. IEEE ICC'01, pp. 50-54, 2001. However, taking into account the properties of zigzag codes, the IOWEF calculations maybe simplified. In particular, let $T^i(W, Z)$ denote the IOWEF of a (i,J,1) zigzag code, then $T^i(W,Z)$ maybe decomposed into even and odd parts, $T^i(W,Z)=T_e^i(W, Z)+T_o^i(W,Z)$ Then, the IOWEF for an (i,J) zigzag code can be calculated recursively using Eqs. 12A and 12B shown in FIG. 20L, where $B_e(W)$ and $B_o(W)Z$ have the form shown in Eqs. 12C and 12D, also shown in FIG. 20L. Assuming uniform random interleavers of size K, the IOWEF for parallel concatenated codes may be obtained from their component codes (see Benedetto and G. Montorsi, Unveiling Turbo Codes: Some Results on Parallel Concatenated Coding Schemes, IEEE Trans. Information Theory, vol. 42, pp. 409-428, March 1996).

Figure 5:
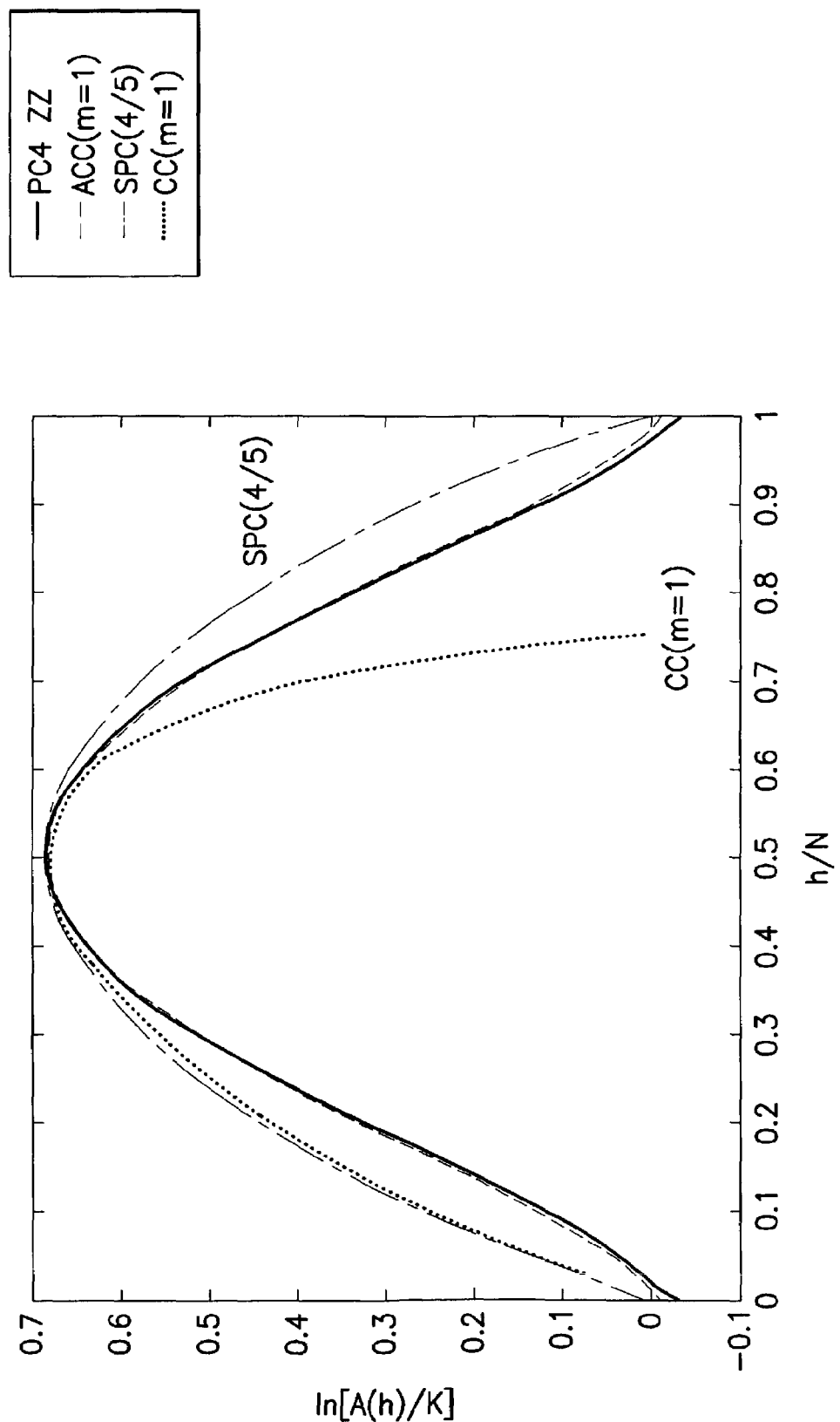
FIG. 5 is a graph illustrating a weight distribution for zigzag codes.

The weight distributions (WD) calculated according to Eqs. 12C and 12D for a 4/5 rate zigzag code and a 1/2 rate code formed by its parallel concatenation (M=4, PC4ZZ) are shown in FIG. 5. For comparison, the WD for the ACC(m=1), and its component code CC(m=1) are also shown in FIG. 5. As can be seen, the WD for the PC4ZZ and the ACC almost coincide, with the PC4ZZ exhibiting slightly lower multiplicities at low weights.

Assuming the use of an optimal global ML decoder, the PC4ZZ theoretically should result in better performance compared to the ACC(m=1).

In order to evaluate the coding constructions one may first use bounding techniques. However, the union bound, being the first bounding technique applied for the analysis of turbo codes, cannot predict the performance above the cutoff rate. Currently a number of bounding techniques have been suggested to obtain tighter bounds, e.g., G. Polyrev, Bounds on the decoding error probability of binary linear codes via their spectra, IEEE Trans. on Information Theory, vol. 40, pp. 1284-1292, July 1994; I. Sason et al., Improved upper bounds on the ML decoding error probability of parallel and serial concatenated turbo codes via their ensemble distance spectrum, IEEE Trans. Information Theory, vol. 46, pp. 24-47, January 2000; and Viterbi et al., New results on serial concatenated and accumulated-convolutional turbo code performance, Annales des Telecommunications, 54, No. 3-4, pp. 173-182, 1999. In particular, the tangential sphere bound (TSB) is an improvement over the union bound, where received noisy signal vectors are isolated if they fall outside of a cone from the correct transmitted vector. Recently this technique was adapted for analysis of ML decoding of turbo codes (see, again, above-cited Sason et al. and Viterbi et al. (1999) publications).

It is preferred to calculate tight ML tangential sphere bounds for different constructions with an accumulator, including zigzag codes. In particular, the TSB on block error rate (BLER) and bit error rate (BER) for different PCZZ constructions, with code rate 1/2, are shown by solid lines in FIGS. 6-8. The selected block size (K=690, N=1380) is typical for proposed GSM enhancements, as well as for WCDMA. As may be expected, the TSB for PCZZ shows better performance as the number of interleavers M is increased. The BLER and BER bounds for 1/2 rate PCZZ and ACC(m=1), with the same block size, are about equal at medium $E_b/N_o$, but the error floor for the PCZZ is lower (see FIGS. 6 and 8). Note that the TSB is derived assuming globally optimal ML decoding for a given block size.

Figure 6:
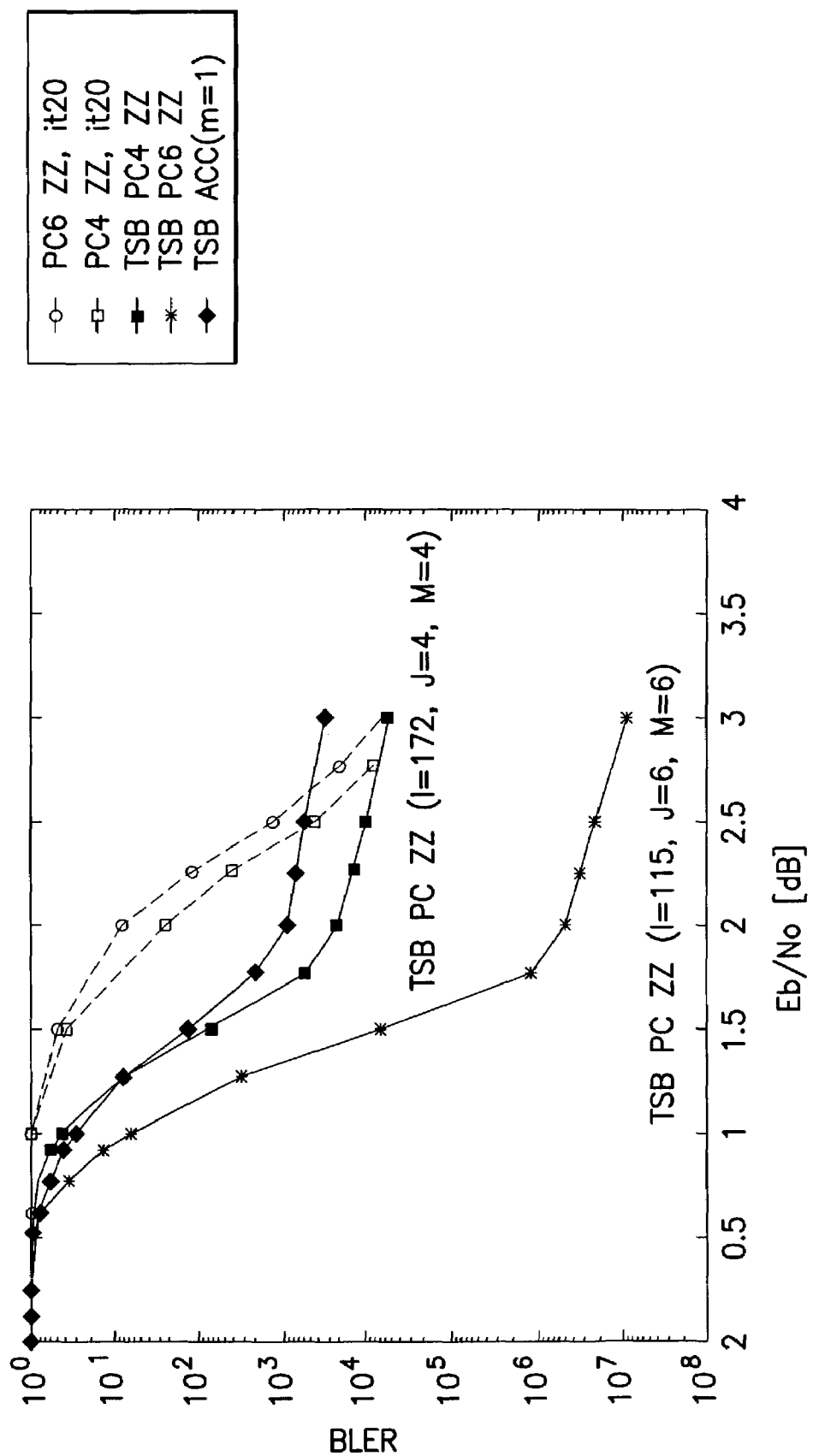
FIG. 6 is a graph illustrating the block error rate (BLER) of 1/2 rate zigzag codes.
Figure 7:
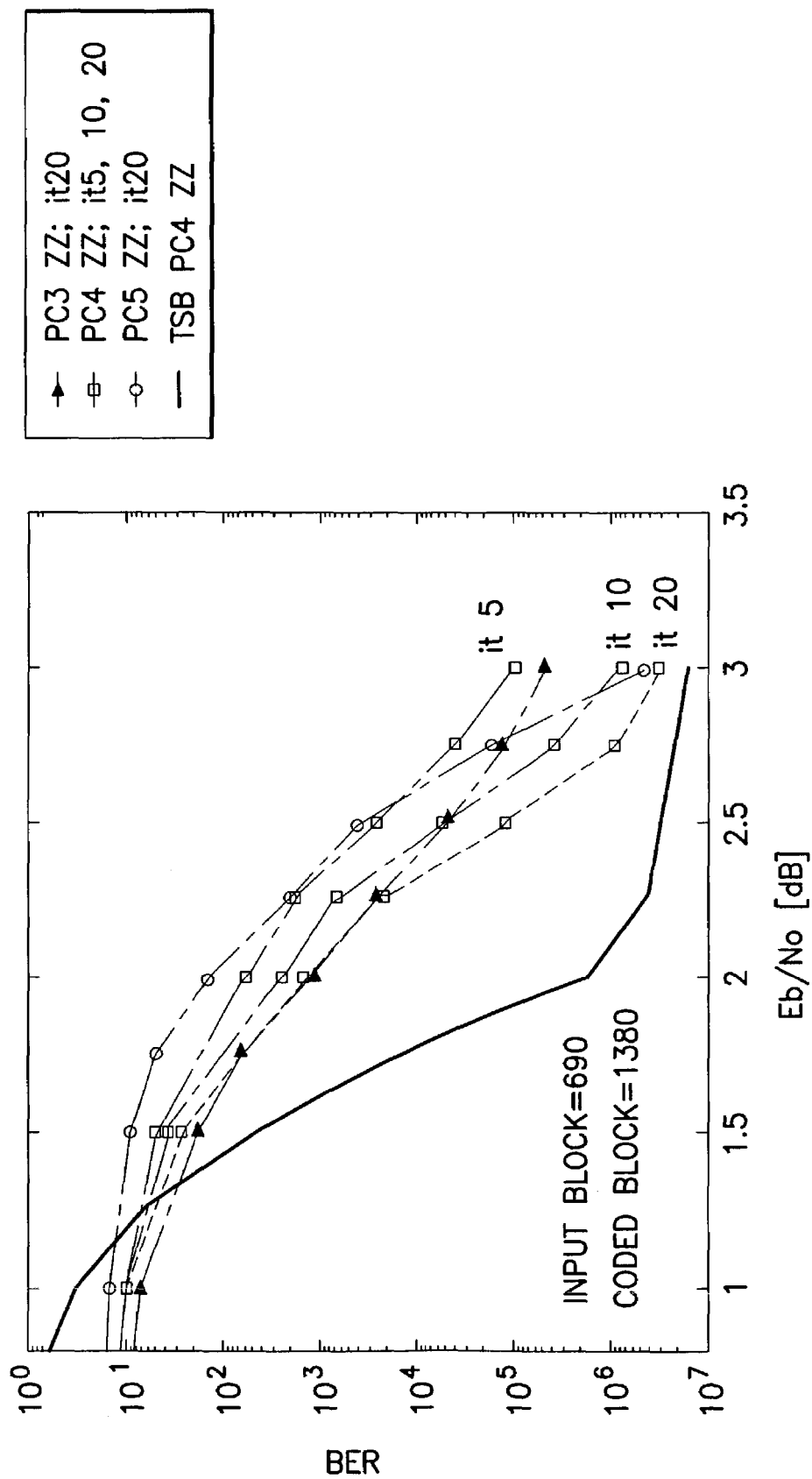
FIG. 7 is a graph illustrating the bit error rate (BER) of 1/2 rate PCZZ:PC5ZZ=(138,5,5), PC4ZZ=(172,4,4) and PC3XX=(230,3,3)

Simulation results for medium coding rates are now discussed. The iterative decoding used in practice is a suboptimal method, and some conclusions on coding constructions made based on the TSB are not always valid. For example, the simulated BLER after 20 iterations for PC6ZZ= (115,6,6) is not as good as that for PC4ZZ=(172,4,4), which is opposite to the TSB predictions (FIG. 6). Comparing the simulated performance of different PCZZ constructions with M=3.6 it was found that M=4 exhibits the best performance at a BER<$10^{-6}$. At the same time, the convergence of iterative decoding for PCZZ typically requires about 20 iterations, with a 0.5 dB loss due to the sub-optimality of the iterative decoding (see FIG. 7). Note that while being simpler, the PC3ZZ shows the same performance as the more complex the PC4ZZ for a BER>$10^{-4}$.

Figure 8:
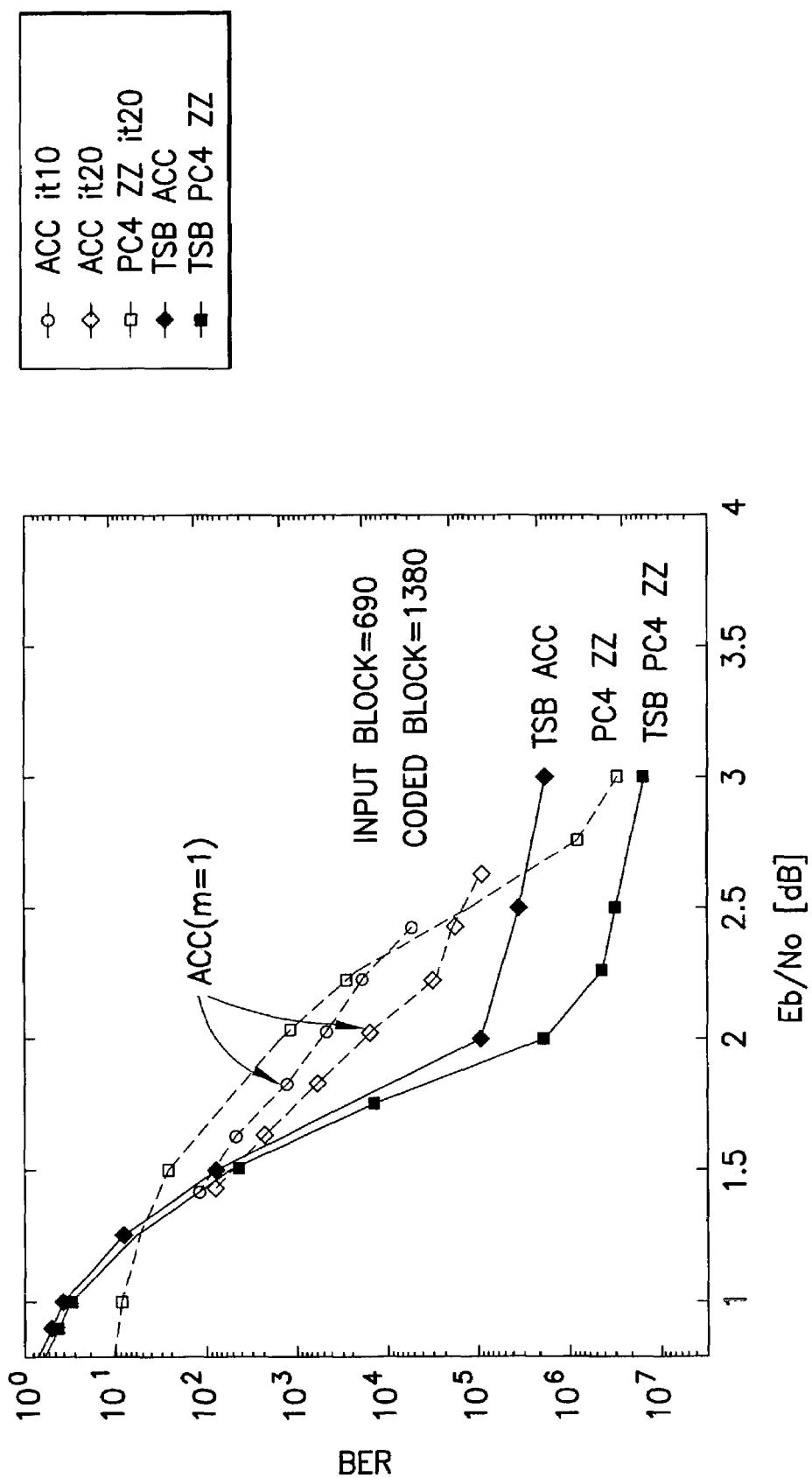
FIG. 8 is a graph illustrating the BER performance of rate 1/2 ACC (m=1) and zigzag codes.

The comparison of the 1/2 rate PC4ZZ and the ACC(m=1) presented in FIG. 8 shows that ACC(m=1) with 10 iteration outperforms the PC4ZZ with 20 iterations, corresponding to 500 AEO/IB and 400 AEO/IB for ACC and PC4ZZ, respectively. Taking into account the larger memory requirements (M=4 interleavers in PC4ZZ) and its relevant input/output operations, the PC4ZZ does not provide much (if any) decoding complexity reduction compared to the ACC(m=1). At the same time, however, the performance of the latter coding scheme is better in the range of BER>$10^{-4}$ and BLER>$10^{-2}$ that is typically used for voice and packet data transmission in wireless communications. Note also that the iterative decoding for ACC(m=1) is within 0.2 dB from the TSB, i.e. it is closer to the optimal ML decoding than for the PC4ZZ.

Figure 9:
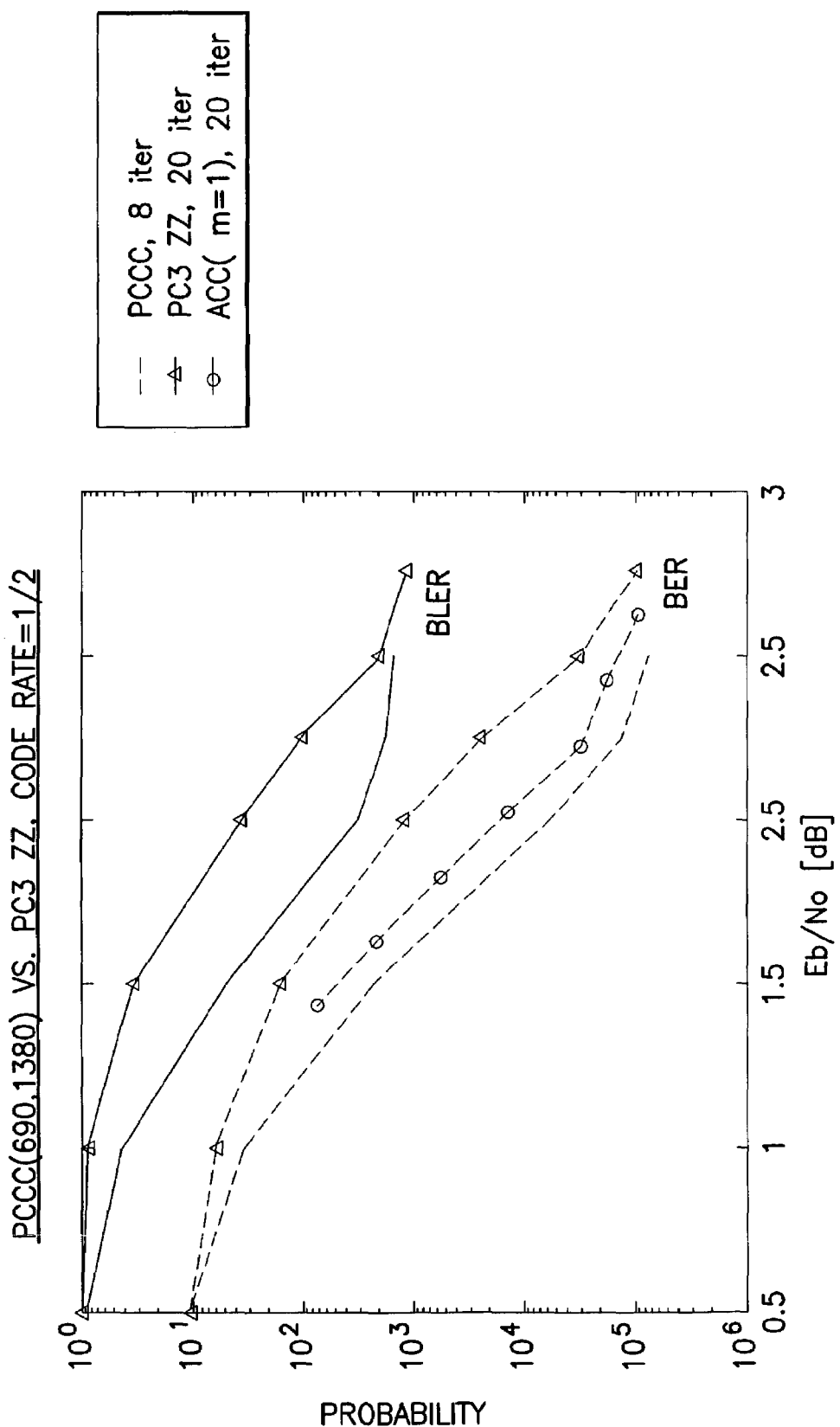
FIG. 9 is a graph illustrating the BER and BLER performance of rate 1/2 PCCC and zigzag codes.

In summary, comparing the performance of the low complexity schemes at medium coding rates (FIG. 9), the ACC (m=1) and PC3ZZ show a loss of 0.1 dB and 0.4 dB, respectively, as compared to the significantly (about 10 times) more complex turbo code (PCCC) specified for 3GPP.

Simulation results for high coding rates are now discussed. High coding rate schemes are attracting increasing attention. For example, efficient high coding rate schemes are required for WCDMA/HSDPA (high speed downlink packet access) and 1×EV-DV. Below the performance of the PCCC specified for WCDMA is compared with the low complexity schemes discussed above.

The code rate of PC4ZZ is R=J/(J+4), with decoding complexity 4(4+4/J). For high coding rates (i.e., for rates larger than J) the PC4ZZ decoding complexity is slightly decreased and approaches 16 AOE/IB/It, while for ACC it remains unchanged. For example, decoding R=0.9 rate PC4ZZ with 20 iterations would require 330 AOF/IB, while decoding of the ACC(m=1) of the same coding rate with 10 iterations would require 500 AOE/IB. Hence, the zigzag coding constructions are more attractive at high coding rates. On the other hand, the decoding complexity of the punctured Parallel concatenated convolution codes (PCCC) does not depend on the coding rate, and is about 3000 AOE/IB after eight iterations.

Figure 10:
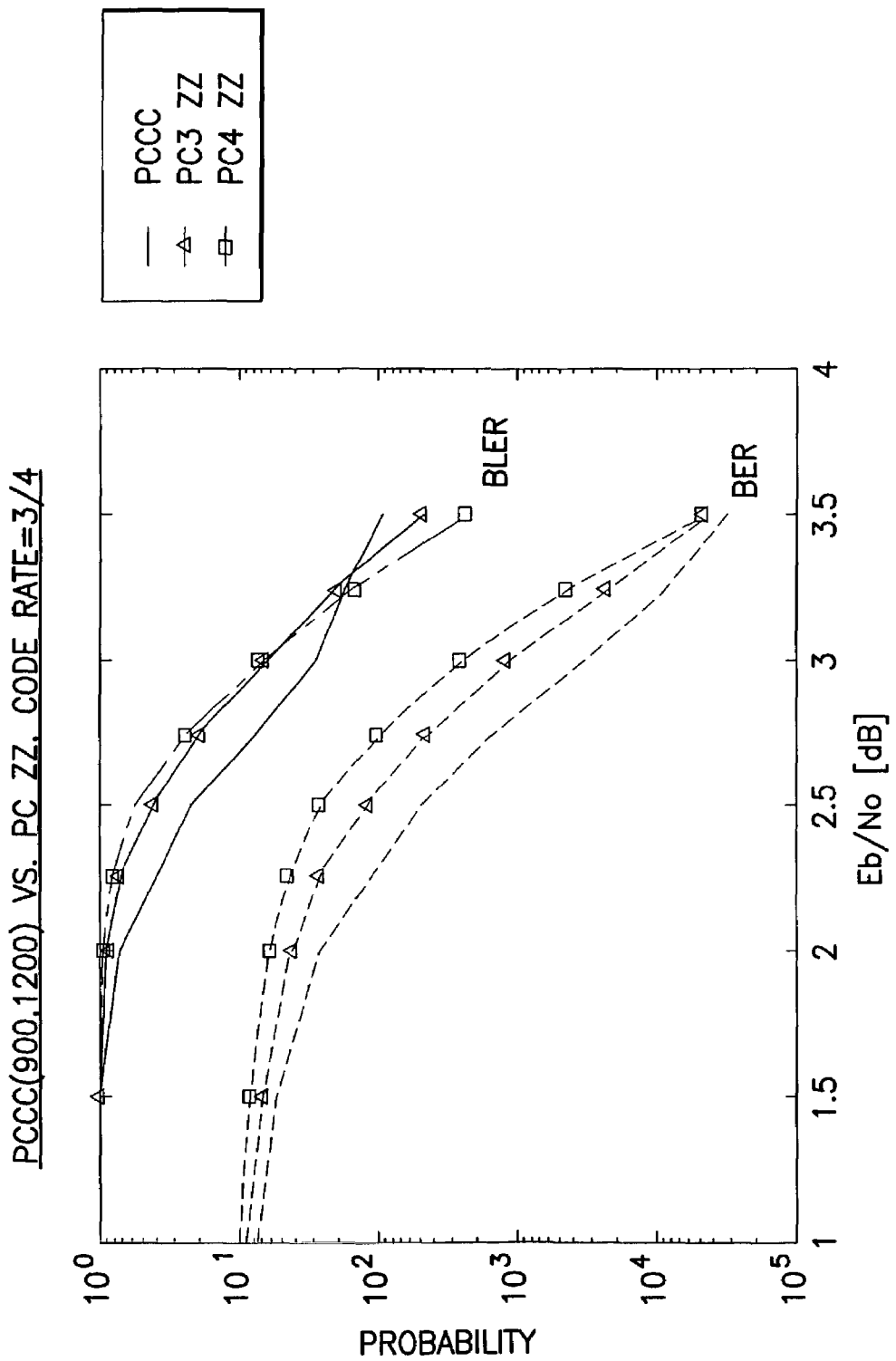
FIG. 10 is a graph illustrating the BER and BLER performance of rate 3/4 PCCC and zigzag codes.
Figure 11:
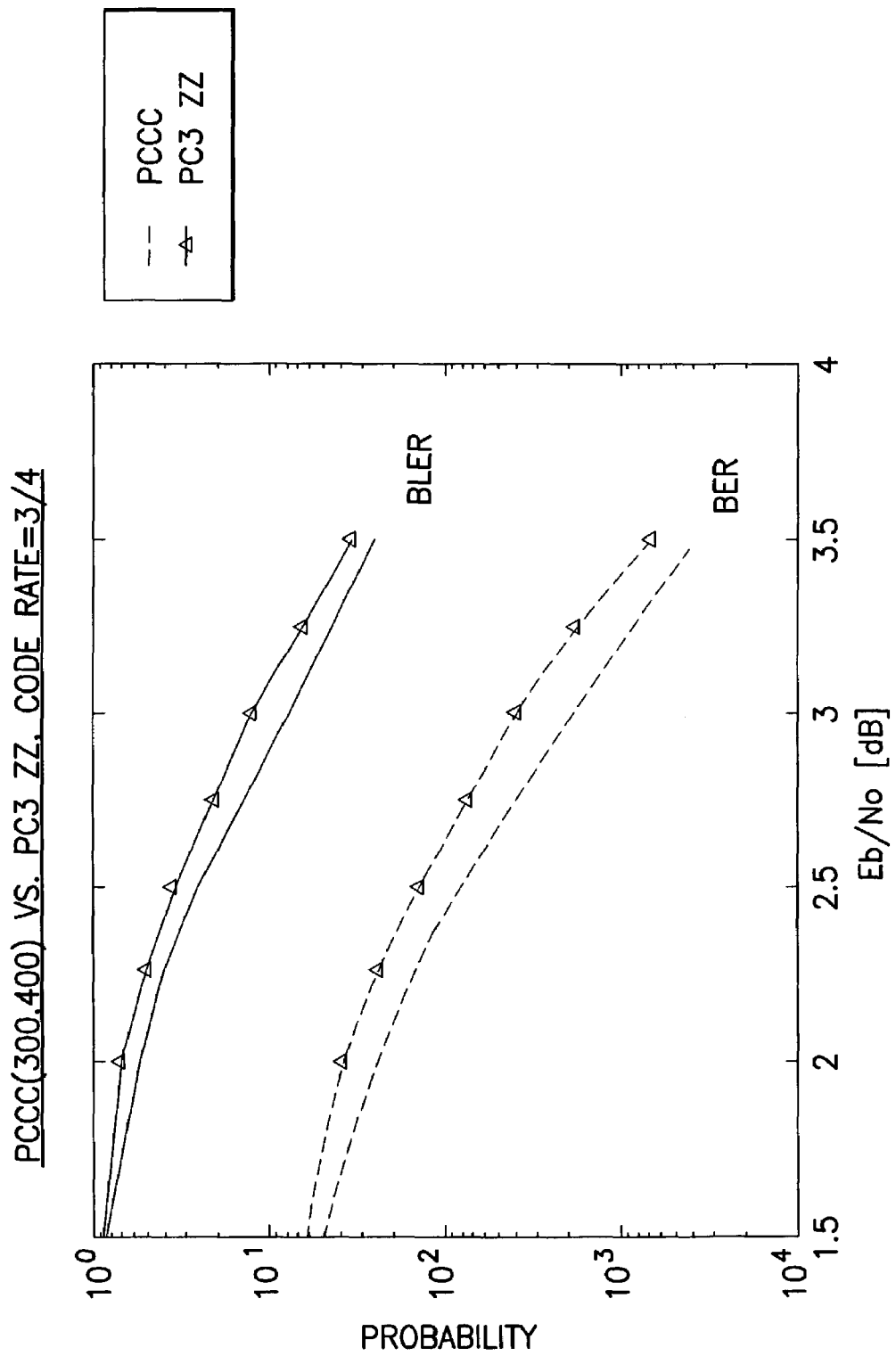
FIG. 11 is a graph illustrating the BER and BLER performance of rate 3/4 PCCC and zigzag codes with short blocks.
Figure 12:
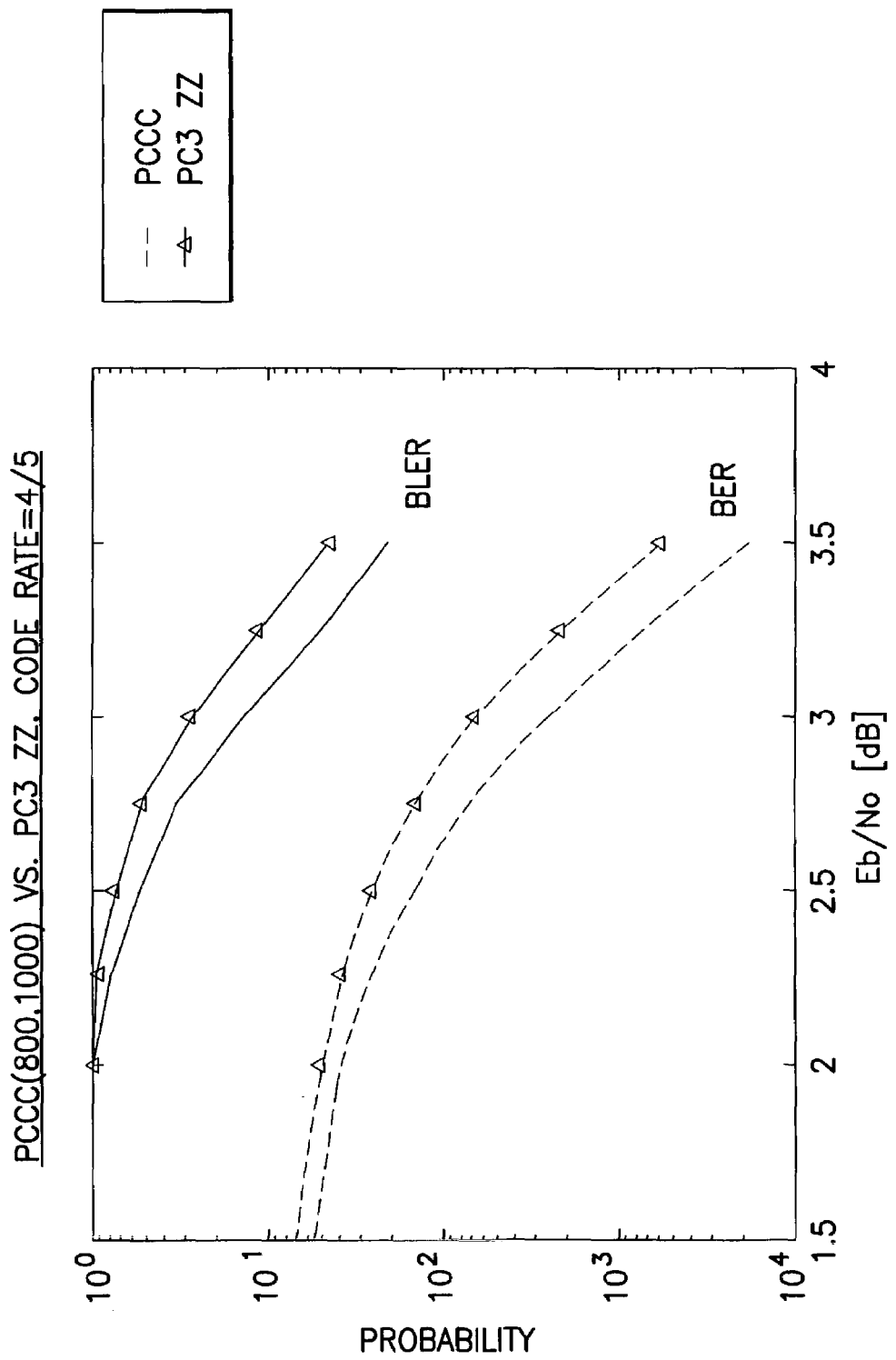
FIG. 12 is a graph illustrating the BER and BLER performance of rate 4/5 PCCC and zigzag codes.
Figure 13:
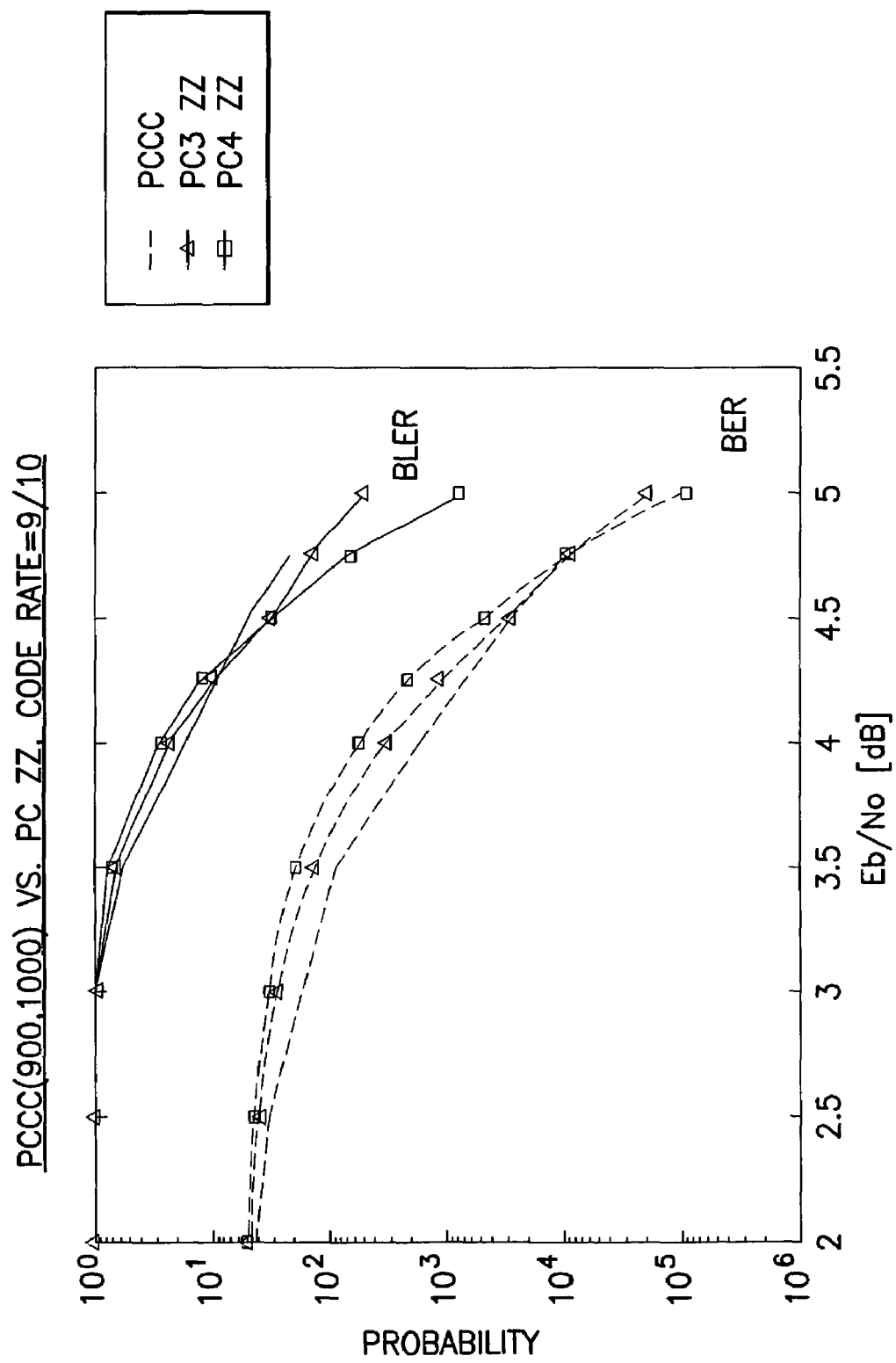
FIG. 13 is a graph illustrating the BER and BLER performance of rate 9/10 PCCC and zigzag codes.
Figure 14:
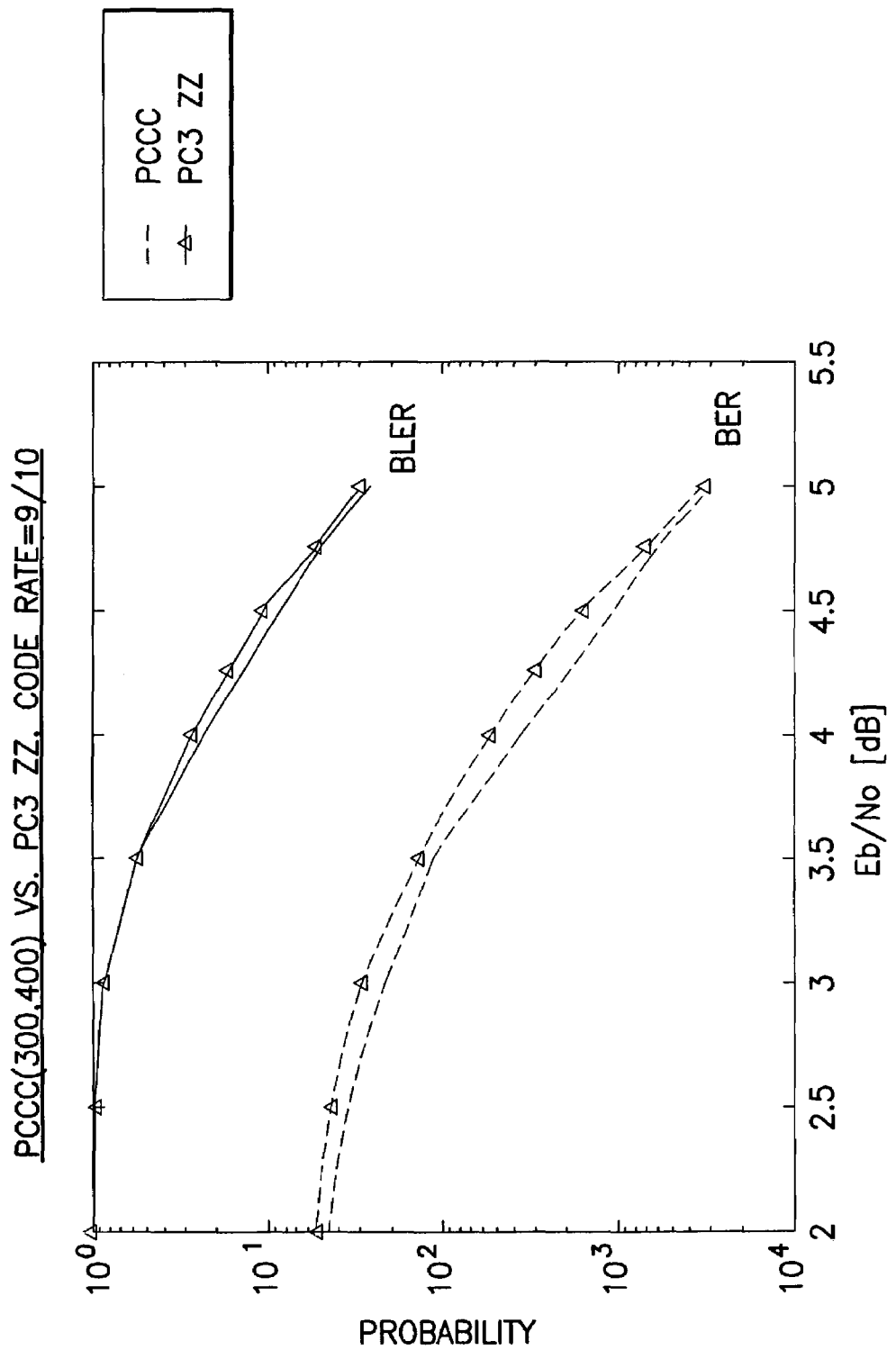
FIG. 14 is a graph illustrating the BER and BLER performance of rate 9/10 PCCC and zigzag codes with short blocks.

FIGS. 10-14 present BER and BLER performance comparisons of turbo codes specified for WCDMA and PCZZ for different coding rates. Among PCZZ constructions the PC3ZZ (M=3) shows the best fit for packet data transmission with requirements BLER=5-10% over all coding rates R≧0.5 (see FIG. 7, FIG. 10 and FIG. 13). On the other hand, the PC4ZZ (M=4) is more preferable for BLER<5%. The performance of the rate 3/4 PC3ZZ is within 0.2 dB of the performance of the PCCC at BLER=$10^{-1}$, while the PC3ZZ outperforms the PCCC at BLER <2% (FIG. 10). At coding rates R<0.9 and BLER=10%, the PC3ZZ loss of about 0.2 dB is about the same for both long and short blocks, i.e., the interleaving gains of the PCCC and the PC3ZZ are the same for R<0.9. However, at R≧0.9 the interleaving gain of the PC3ZZ is larger than for the PCCC, i.e., the benefits of the use of the PC3ZZ over the PCCC become more apparent as the block size is increased (see FIGS. 13 and 14).

Generalized Zigzag Codes

Discussing first a unified coding scheme for different coding rates, and as was shown above, the PCZZ constructions, being much simpler, outperform the PCCC at high coding rates. This permits one to consider PCZZ (M=3) as a coding scheme for high data rate applications that currently are based on PCCC. On the other hand, the use of the PCZZ(M=3) approach in, for example, the 3GPP standard would require a specification of at least one additional interleaver to be maintained in the memory of the mobile terminal. Furthermore, the original PCZZ design implies different interleavers for different coding rates that could possibly make the PCZZ standardization problematic. It has been found that puncturing methods (specified for PCCC to change the coding rate) when applied to PCZZ result in noticeable performance degradation (about 0.5 . . . 0.7 dB), as compared to a PCZZ constructed specifically for the required coding rate.

Figure 15:
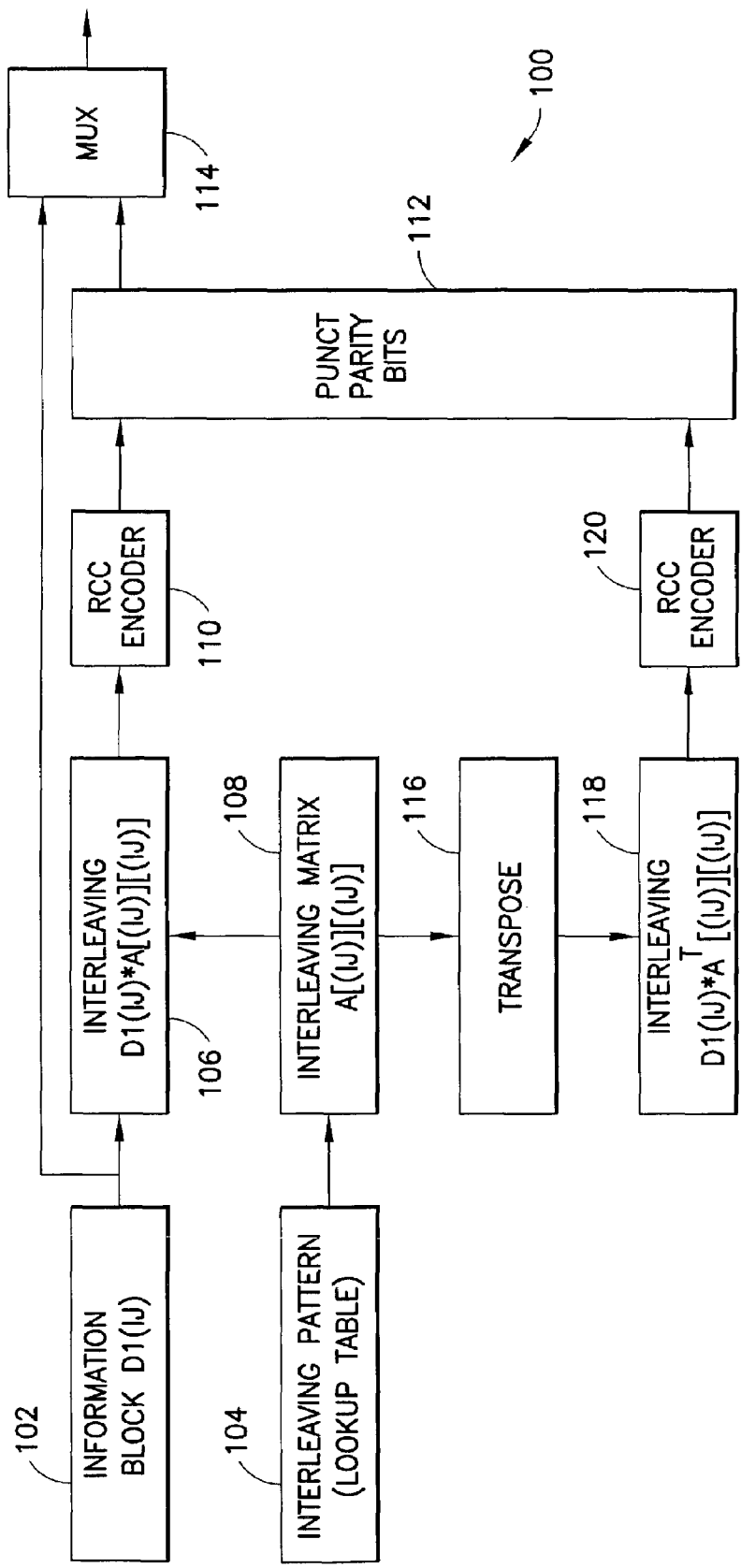
FIG. 15 is a block diagram of a combined encoder for PCCC and PCZZ in accordance with an aspect of this invention.

Presenting zigzag codes in form of the puncturing differential encoder (see FIG. 3B) enables one to merge PCCC and PCZZ into a general framework. The preferred embodiment of the combined encoder 100 for the PCCC and PCZZ codes is shown in FIG. 15, where blocks 102-114 present the PCCC encoder, and blocks 116 (transpose), 118 (interleaver) and 120 (recursive convolutional code (RCC) encoder) represent the PCZZ encoder portion. The generative polynomials for the RCC encoders, blocks 110 and 120, may be selected either according to the PCCC, as in 3GPP, or reduced to differential encoders (which is a subset of PCCC polynomials). The differential encoders, after proper puncturing, are equivalent to PCZZ (see FIG. 3B).

To avoid a requirement for second interleaver storage for PCZZ the following method is preferred. Currently in the 3GPP standard different interleaving patterns are specified for different block sizes. Consider a certain block size $N_b=I*J$ and its associated interleaving pattern (lookup table) stored in a memory array. The preferred approach may be explained most easily by a matrix presentation. The result of interleaving 'd may be presented in a form of matrix multiplication 'd $[N_b]=d[N_b]A[N_b][N_b]$, where $d[N_b]$ is an information block of length $N_b$, and where $A[N_b]$ is a specified $N_b$ times $N_b$ permutation matrix. Now one may apply a simple matrix transform for A, e.g., matrix transposition, to obtain another permutation matrix 'A. Note that there is no need to store another $N_b$ times $N_b$ permutation matrix. Given parameters I and J, the transformation may be performed directly on the interleaving pattern. For example, if the interleaving pattern is stored in a memory array, then the swapping of address indices yields another permutation matrix. Also, other matrix transformations may be used, e.g., cyclic shifts both for and between rows. Simulation results show no difference between two compared PCZZ schemes: (i) PCZZ(M=3) with two random interleavers; and (ii) PCZZ(M=3), where one interleaver and its transposed version are used. Thus, re-use of an interleaver provides additional benefits related at least to the required memory size.

As was mentioned above with regard to FIG. 15, changing the PCZZ rate by puncturing results in a performance loss. Another method to change the coding rate for PCZZ is to use a proper selection of parameters I and J. In particular, for PCZZ these parameters may be calculated as $J=\lfloor MR/(R-1) \rfloor$; $I=\lfloor N_b/J \rfloor$. For example, consider $N_b=900$ and its associated interleaving pattern. Above it was found that M=3 is optimal for a BLER of about $10^{-1}$. To obtain the coding rate R=3/4 the data (and its interleaving pattern) may be presented in the form of an I X J matrix, where $J=3*\lfloor 0.75/(1-0.75) \rfloor=9$; $I=\lfloor 900/9 \rfloor=100$. If the coding rate is R=4/5, then $J=3*\lfloor 0.8/(1-0.8) \rfloor=4$; $I=\lfloor 900/4 \rfloor=225$. Note that while the specified interleaving pattern remains unchanged, the interleaving pattern is partitioned in different ways according to the values of parameters I and J. The second interleaver for PCZZ is obtained by a proper transform of the initial interleaving vector.

As can be seen, the presently preferred encoder embodiment of FIG. 15 combines both the PCCC and PCZZ embodiments, and it allows reuse of PCCC blocks to build a low decoding complexity PCZZ for use at high coding rates.

Figure 16:
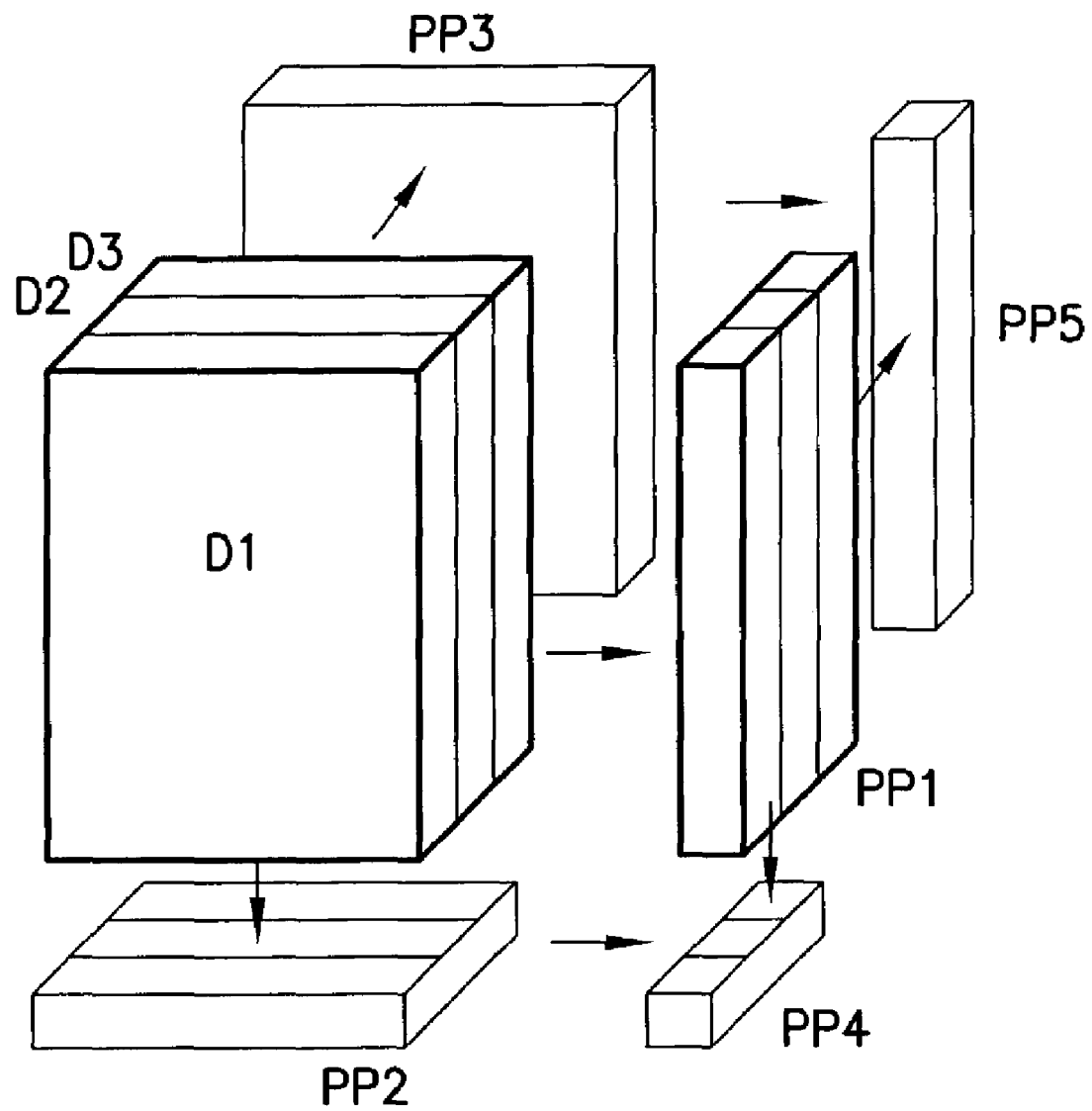
FIG. 16 is a representation of multi-dimensional concatenated zigzag codes with different parity bits arranged in parity planes.
Figure 17:
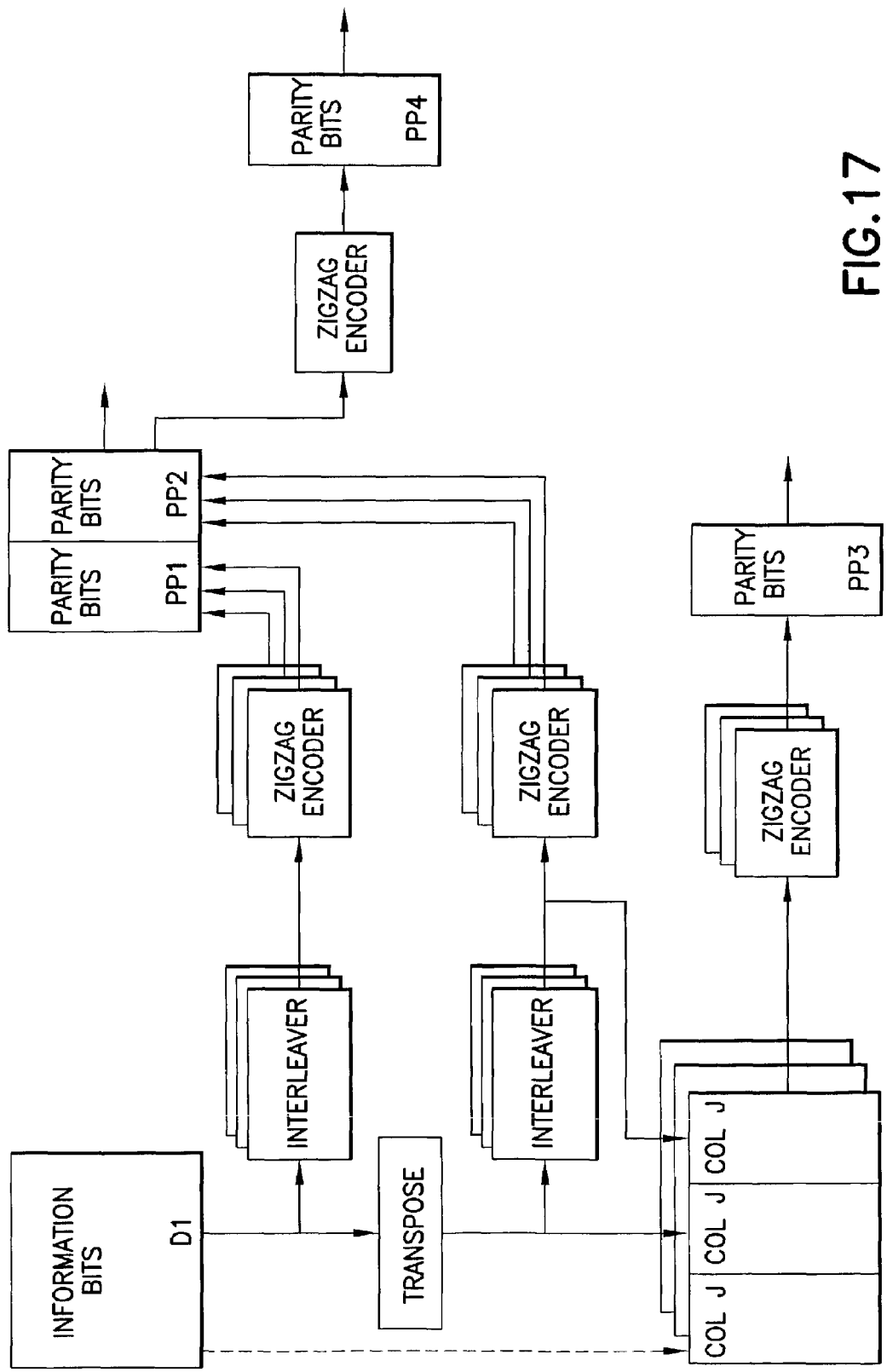
FIG. 17 is a block diagram of an encoder for multi-dimensional concatenated zig-zag codes.

Discussing now the multi-dimensional concatenation of zigzag codes, concatenated zigzag codes may be generalized to a multi-dimensional format as shown at FIG. 16. In this case the different parity bits are arranged in parity planes (PP1, PP2, ..., PP5, etc.), thereby enabling the coding rate to be changed without interleaver modification. In other words, adding more dimensions gives another way to change the coding rate, but without requiring re-partitioning of the data as in the unified coding scheme discussed above. This property is particularly useful for retransmission schemes where parity bits formed from another dimension may be sent during retransmission. This approach allows one to begin with an uncoded transmission, and to then use PCZZ to gradually add redundancy bits without switching to PCCC at medium coding rates (since combining parity bits from PCZZ and PCCC is not straightforward).

Discussing now a modified zigzag decoder, the standard PCZZ decoder described above with reference to FIG. 4 may be modified to improve the performance, while also simplifying the decoding complexity. First, it should be noted that due to the zigzag code structure the last parity bit is equal to the sum of all data bits in a block, as can be seen in Eq. 13 of FIG. 20M. Since interleaving does not change this sum, the last parity bits for every data plane (e.g., lowest bits in every column in parity plane PP1, see FIG. 16) must be the same. This property may be used to correct relevant received bits both before (e.g., using a simple majority rule) and during iterative decoding.

Another, more complex technique to improve performance is to utilize all extrinsic information during iterative decoding. Note that in the case of PCZZ iterative decoding the extrinsic information $E_{Di}$ (FIG. 4) is calculated only for data bits, and the likelihood information for parity bits $L_{Pi}$, i=1, ..., M are not updated during iterations. In order to include extrinsic information for the parity bits in the iterations it is preferred to re-calculate soft values for parity bits $L_{Pi}^{(k)}$ for each iteration k, as is shown in blocks 202, 204 and 206, as well as 203, 205 and 207, of the modified iterative PCZZ decoder 200 of FIG. 18. This may be accomplished either in the separate blocks 202, 204, 206 following each MLA decoder 210A-210C, based on soft values for data bits $L_{Di}^{(k)}$, or recursively within the MLA decoders 210A-210C, as is shown in Eq. 14 of FIG. 20N, with the boundary conditions $L^{(k)}[p(0)]=+\infty$ for all k; i=1, ..., I.

Note that recursive expression of Eq. 14 is relatively simple in form, and is similar to the earlier calculated forward recursion value F[p(i)], where F[p(i–1)] is replaced by $L^{(k-1)}[p(i-1)]$.

A discussion is now made of the termination or stopping rules for the iterative PCZZ decoding technique. The decoding complexity of PCZZ has been evaluated under the assumption that the decoder performs 20 iterations. However, the number of iterations (hence, decoding complexity) may be reduced, without a significant loss of performance, with a properly designed stopping rule.

Figure 19A:
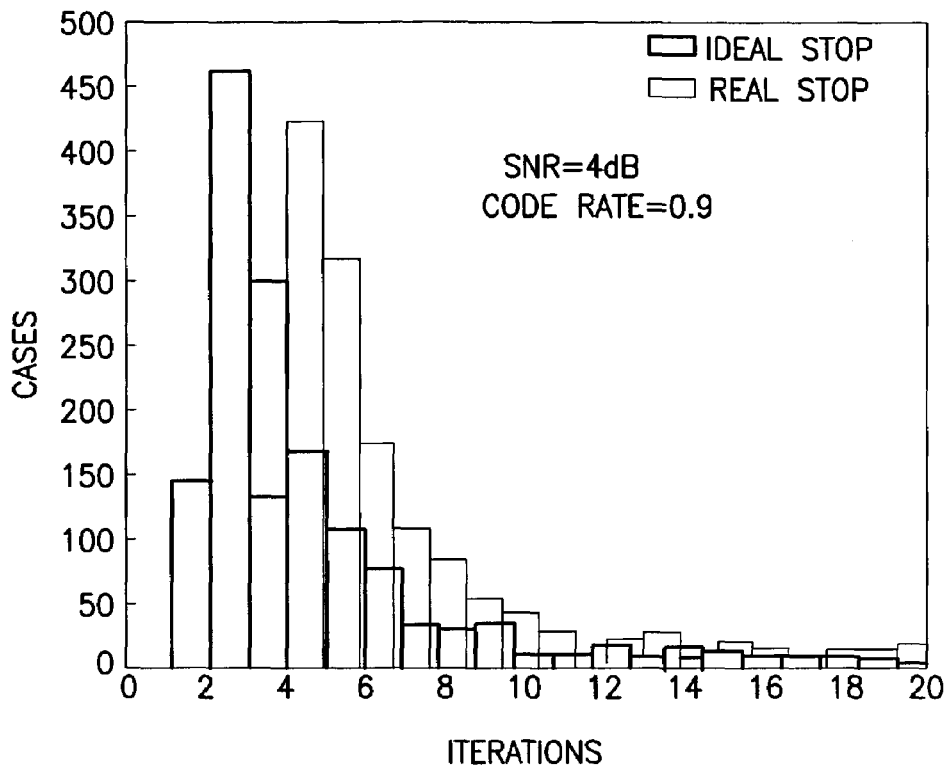
FIGS. 19A and 19B, collectively referred to as FIG. 19, are histograms illustrating the number of iterations for an ideal and a suggested iteration termination or stopping rule for a rate R=9/10 PCZZ (M=3) decoder assuming SNR=4 dB (FIG. 19A) and SNR=4.5 dB (FIG. 19B)
Figure 19B:
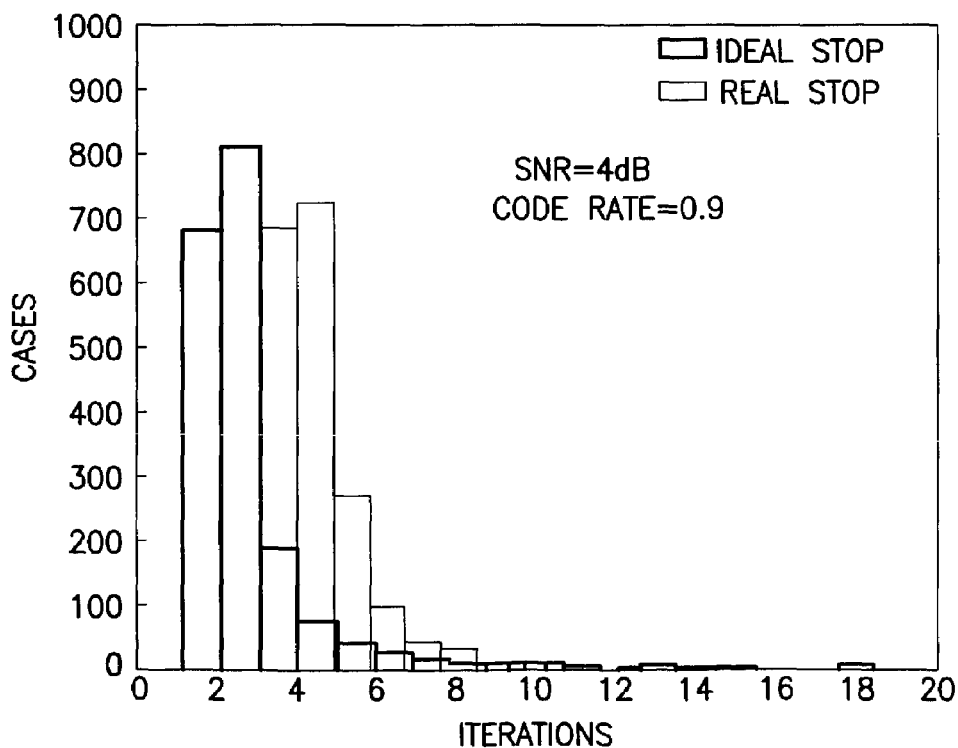

The results of the iteration process fall into one of the following categories: (a) convergence to a correct codeword; (b) convergence to an incorrect codeword; and (c) no convergence. In an ideal case (ideal stopping rule), the decoder terminates the iterations as it converges to a correct codeword. This avoids the use of additional processing and reduces power consumption. For PCZZ codes it is found that convergence to a correct codeword, with an ideal stopping rule, typically occurs within two to five iterations (depending on the SNR), and only for some specific error patterns appearing in received blocks will more iterations be required. As an example, FIG. 19 shows a histogram for the number of iterations converging to a correct codeword, with an ideal stopping rule, for a rate R=9/10 PCZZ (M=3) decoder. As can be seen in FIG. 19B, it requires on average 2.45 iterations to converge to a correct codeword at a SNR=4.5 dB. Taking into account that the decoder still performs 20 iterations for wrongly decoded codewords (as can occur in BLER*100% cases), on average the decoder 200 uses 2.45*(1–BLER)+20*BLER=3.2 iterations, with an ideal stopping rule.

In practice, while one may not know if a decoded codeword is correct, but one may rely on decoded soft decisions to evaluate the probability of the correctness of the codeword. At the same time, it is known that the decoder may be viewed as a likelihood amplifier, and if an iterative process converges then the decoded likelihoods are amplified, and the signs are not changed. In the case of PCZZ it may be shown that since $L^{(k-1)}[p(IM)]$ accumulates reliability information for all data and parity check bits, then this value is very small when the iterative process does not converge. This property enables the control of the convergence of the iterative decoder 200 by monitoring $L^{(k-1)}[p(IM)]$. In particular, a simple stopping rule may be defined as $L^{(k-1)}[p(IM)]>$ threshold, where threshold depends on the block size. A histogram for the number of iterations with the stopping rule $L^{(k-1)}[p(IM)]>0.05$ is shown in FIG. 19. As can be seen, in the case of convergence with the suggested stopping rule it requires more (on average 4.33) iterations than with the ideal stopping rule, since there is no information if the decoder converges to a correct or an incorrect codeword. In total then, taking into account the non-convergence cases (i.e., when $L^{(k-1)}p(IM)<0.05$), the decoder needs, on average, only 4.9 iterations, i.e., about five times fewer than what is shown for PCZZ in Table 1 of FIG. 21A.

Figure 18:
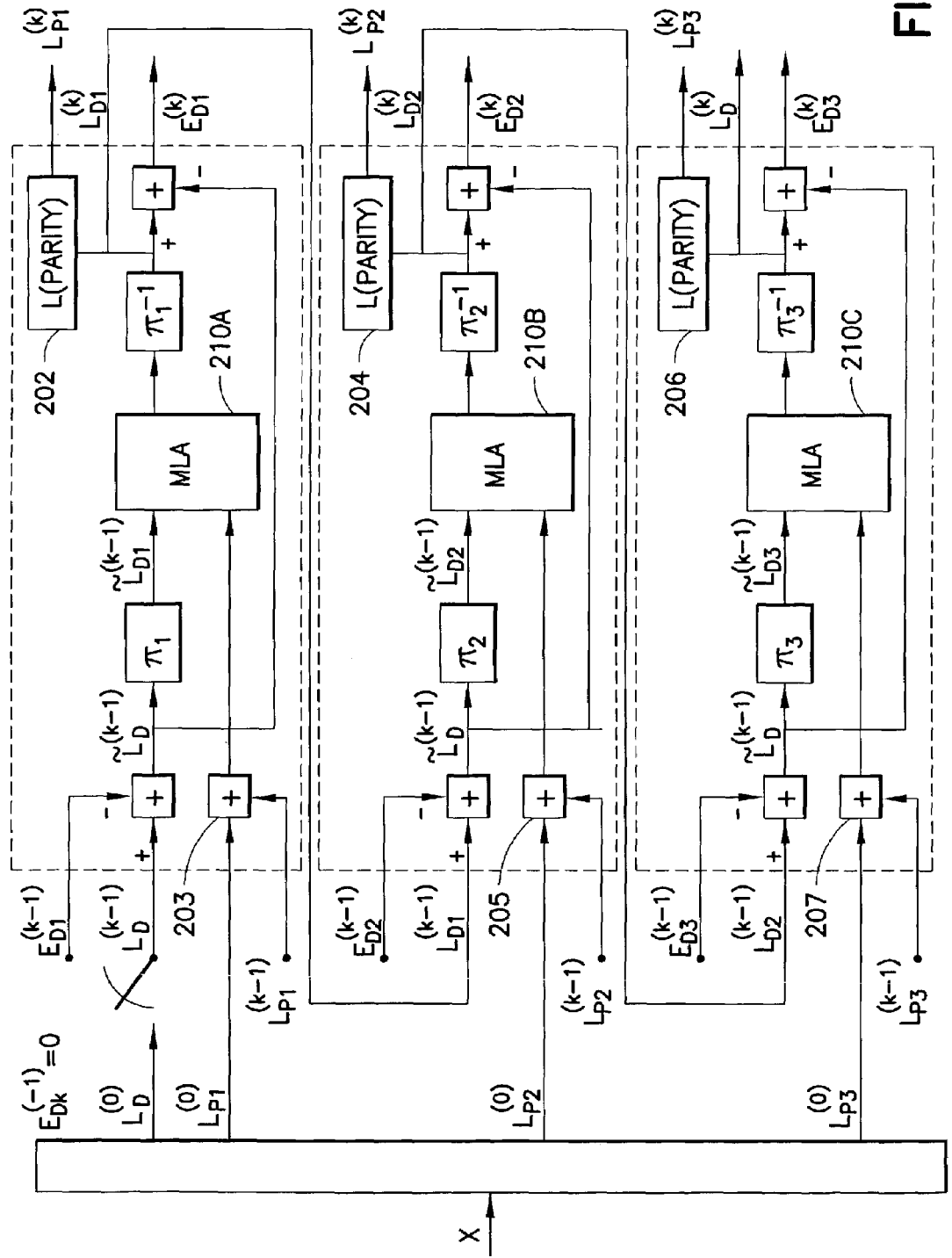
FIG. 18 is a block diagram of an embodiment of an iterative PCZZ decoder in accordance with a further aspect of this invention.

Note that $L^{(k-1)}[p(IM)]$ may be used in the modified decoder 200 of FIG. 18, and this simple stopping rule results in several times less decoding complexity for PCZZ, as compared to the case illustrated in Table 1. FIG. 21 makes it clear that a comparison of PC3ZZ decoders with 20 iterations, and the suggested stopping rule, shows no difference in performance. Transposed interleavers are preferably used in the PC3ZZ decoder 200 when the stopping rules are applied. Table 2, shown in FIG. 21B, depicts the number of iterations for the ideal and the suggested stopping rules.

A decoder 200 iteration stopping rule may thus be implemented by testing a likelihood measure associated with a last parity check symbol in a parity check column. In one case the likelihood measure may be given by $L^{(k-1)}[p(IM)]>$ threshold, and in another case the likelihood measure may be given by $L^{(k-1)}[p(I)]>$ threshold. The likelihood measure is given in general by: $L^{(k-1)}[p(IM)]>$ threshold, $L^{(k-1)}[p(2I)]>$ threshold, ..., $L^{(k-1)}[p(IM)]>$ threshold, where the value of the threshold is a function of data block size.

As a summary of the foregoing, a comparison of the low complexity concatenated codes PCZZ and ACC, using tight ML theoretical bounds and simulation results, has been made, as has a comparison of these code constructions with the turbo codes specified for WCDMA. It has been shown that the considered low complexity concatenated codes provide performance that is about the same as the PCCC, at medium and high coding rates. It has also been shown that the decoding complexity of these constructions is significantly (up to 10 times) less than the complexity of the turbo codes specified in the 3GPP standard.

In particular, it has been shown that increasing the number of interleavers, M>4 in PCZZ constructions, improves the ML decoding bound, but results in performance degradation due to the sub-optimality of iterative decoding. It has also been shown that the ACC and PCZZ codes perform within about 0.5 dB from a tight ML tangential sphere bound. It has also been shown that the ACC(m=1) is within 0.1 dB from the 3GPP turbo code performance at medium coding rates, and that ACC(m=1) shows better performance at medium coding rates than zigzag code concatenations at about the same decoding complexity. It has also been shown that the zigzag-based coding constructions are more attractive solutions for high coding rates, as compared to the ACC constructions. As an example, the PC3ZZ shows about 0.4 dB loss in performance, as compared to the PCCC at a BLER=$10^{-1}$ at moderate coding rates (e.g., R=1/2). The loss decreases as the code rate increases (e.g., about 0.2 dB at R=3/4), and disappears at high (R>0.9) coding rates.

It has also been shown that the PCZZ performance curves exhibit a more optimum slope than the PCCC performance curves, resulting in better performance at high SNR. In addition, it was shown that PC3ZZ (M=3) appears to exhibit the best performance among the PCZZ constructions for packet transmission with QoS BLER requirements in the range of about 5% to 10%, while PC3ZZ (M=4) is preferable for a BLER <5%. The PC3ZZ interleaving gain has been shown to be greater than that of PCCC at a coding rate R≧0.9, and is the same as PCCC at a coding rate of 0.75<R<0.9.

Generalized zigzag codes have also been presented, and the following improvements disclosed: (a) the use of the unified encoder 100 embodiment (FIG. 15) for different coding rates combining PCCC and PCZZ; (b) a PCZZ embodiment that uses but one stored interleaver (or that reuses a PCCC interleaver); (c) a multi-dimensional concatenation of zigzag codes for use in a re-transmission embodiment; (d) modifications for the zigzag decoder 200 to improve performance and convergence; and (e) simple stopping rule for iterative PCZZ decoding that result in a further reduction (e.g., several times) in decoder complexity.

It should also be noted that while multi-dimensional zigzag codes may be constructed as described by Ping et al., Iterative Decoding of Multidimensional Concatenated Single Parity Check Codes, in Proc. IEEE ICC'98, pp. 131-135, 1998, in their approach M interleavers are used to build an M-dimensional code. However, as aspect of this invention is that a multi-dimensional zigzag code (which may be stated as an M-dimensional code) may be constructed with less than M (<M) interleavers. For example, with two interleavers in FIG. 16 forming data planes D2 and D3 (note that D1 is non-interleaved information data), one may build not only one parity plane PP1 (in this example with three parity columns as according to Ping et al.), but also other parity planes PP2, PP3, PP4, PP5. These additional parity symbols in parity planes PP2-PP5 provide additional redundancy symbols, and hence allow one to build lower channel rate codes without rearranging or adding more interleavers (as one would be required to do if using the approach of Ping et al.) From a standardization and implementation point of view one would typically not wish to increase the number of interleavers more than has already been done for PCCC. Hence, this approach allows one to increase the dimensionality of the PCZZ, and to construct a low channel rate coding scheme, without introducing additional interleavers. Note further that this can be accomplished independent of the reduction of interleavers by the use of the transpose operation described above, as well as independent of the coding rate change based on selection of parameters I and J. Stated briefly, this aspect of the invention enables one to add additional code dimensions (and relevant parity check symbols) by using properties of already specified interleaver(s), and without adding more interleaver(s).

While these teachings have been particularly shown and described with respect to preferred embodiments thereof, it will be understood by those skilled in the art that changes in form and details may be made therein without departing from the scope and spirit of these teachings.

What is claimed is:

1. An iterative parallel concatenated zigzag data decoder comprising circuitry for utilizing all extrinsic information during iterative decoding by updating likelihood information for parity bits $L_{Pi}$, i=1, . . . , M during iterations, where M indicates a number of interleavers used during a concatenated coding technique.

2. A decoder as in claim 1, where extrinsic information for the parity bits is included in iterations by re-calculating soft values for parity bits $L_{Pi}^{(k)}$ for each iteration k.

3. A decoder as in claim 2, where the parity bit soft values are re-calculated in a plurality of circuit blocks, that follow a plurality of Max-Log-APP decoder blocks, based on soft values for data bits $L_{Di}^{(k)}$.

4. A decoder as in claim 2, where the parity bit soft values are re-calculated recursively within a plurality of Max-Log-APP decoder blocks.

5. A decoder as in claim 1, where said decoder operates to control the convergence of the decoder by monitoring a soft value of one parity check symbol, $L^{(k-1)}[p(IM)]$, where p(IM) represents last parity check bits in an I×M parity check array.

6. A decoder as in claim 5, where a decoder iteration stopping rule is implemented by testing a likelihood measure associated with a last parity check symbol in a parity check column.

7. A decoder as in claim 6, where the likelihood measure is given by $L^{(k-1)}[p(IM)]>$threshold, where the value of the threshold is a function of data block size.

8. A decoder as in claim 6, where the likelihood measure is given by $L^{(k-1)}[p(I)]>$threshold, where the value of the threshold is a function of data block size.

9. A decoder as in claim 6, where the likelihood measure is given in general by: $L^{(k-1)}[p(I)]>$threshold, $L^{(k-1)}[p(2I)]>$threshold, . . . , $L^{(k-1)}[p(IM)]>$threshold, where the value of the threshold is a function of data block size.

10. A method for operating an iterative parallel concatenated zigzag data decoder, comprising: receiving encoded data; and iteratively decoding said encoded data utilizing all extrinsic information; where iteratively decoding comprises updating likelihood information for parity bits $L_{Pi}$, i=1, . . . , M during iterations, where M indicates a number of interleavers used during a concatenated data encoding technique.

11. A method as in claim 10, where utilizing said extrinsic information for the parity bits comprises re-calculating soft values for parity bits $L_{Pi}^{(k)}$ for each iteration k.

12. A method as in claim 11, where the step of re-calculating the parity bit soft values is performed in a plurality of circuit blocks, following a plurality of Max-Log-APP decoder blocks, based on soft values for data bits $L_{DI}^{(k)}$.

13. A method as in claim 11, where the step of re-calculating the parity bit soft values is performed recursively within a plurality of Max-Log-APP decoder blocks.

14. A method as in claim 10, further comprising controlling the convergence of the decoder by monitoring a soft value of one parity check symbol, $L^{(k-1)}[p(IM)]$, where p(IM) represents last parity check bits in an I×M parity check array.

15. A method as in claim 14, where relevant parity symbols are corrected before iterative decoding, using a majority rule, or during iterative decoding.

16. A method as in claim 14, further comprising testing a likelihood measure associated with a last parity check symbol in a parity check column for implementing a decoder iteration stopping rule.

17. A method as in claim 16, where the likelihood measure is given by $L^{(k-1)}[p(IM)]>$threshold, where the value of the threshold is a function of data block size.

18. A method as in claim 16, where the likelihood measure is given by $L^{(k-1)}[p(I)]>$threshold, where the value of the threshold is a function of data block size.

19. A method as in claim 16, where the likelihood measure is given in general by: $L^{(k-1)}[p(I)]>$threshold, $L^{(k-1)}[p(2I)]>$threshold, . . . , $L^{(k-1)}[p(IM)]>$threshold, where the value of the threshold is a function of data block size.

20. A method for operating an iterative parallel concatenated zigzag data decoder, comprising: receiving encoded data; iteratively decoding said encoded data utilizing extrinsic information; and controlling convergence of the decoder by monitoring a soft value of one parity check symbol, $L^{(k-1)}[p(IM)]$, where p(IM) represents last parity check bits in an I×M parity check array.

21. A method as in claim 20, further comprising testing a likelihood measure associated with a last parity check symbol in a parity check column for implementing a decoder iteration stopping rule.

22. A method as in claim 21, where the likelihood measure is given by one of $L^{(k-1)}[p(IM)]>$threshold, or by $L^{(k-1)}p(I)]>$threshold, where the value of the threshold is a function of data block size.

23. A method as in claim 21, where the likelihood measure is given in general by: $L^{(k-1)}[p(I)]>$threshold, $L^{(k-1)}[p(2I)]>$threshold, . . . , $L(k-1)[p(IM)]>$threshold, where the value of the threshold is a function of data block size.

24. A method as in claim 20, where iteratively decoding comprises updating likelihood information for parity bits $L_{Pi}$, i=1, . . . , M during iterations, where M indicates a number of interleavers used during a concatenated data encoding technique.

* * * * *

UNITED STATES PATENT AND TRADEMARK OFFICE
CERTIFICATE OF CORRECTION

| | | |
|---|---|---|
| PATENT NO. | : 7,653,858 B2 | Page 1 of 1 |
| APPLICATION NO. | : 10/325240 | |
| DATED | : January 26, 2010 | |
| INVENTOR(S) | : Nefedov | |

It is certified that error appears in the above-identified patent and that said Letters Patent is hereby corrected as shown below:

Claim 12, col. 13, line 32 delete "DI" and insert --Di--.

Signed and Sealed this

Twenty-third Day of March, 2010

David J. Kappos
*Director of the United States Patent and Trademark Office*